United States Patent
Efrati

(10) Patent No.: US 9,924,251 B2
(45) Date of Patent: Mar. 20, 2018

(54) TRANSDUCER HOLDER

(71) Applicant: Mor Efrati, Givat-Yishayahu (IL)

(72) Inventor: Mor Efrati, Givat-Yishayahu (IL)

( * ) Notice: Subject to any disclaimer, the term of this patent is extended or adjusted under 35 U.S.C. 154(b) by 0 days.

(21) Appl. No.: 15/218,569

(22) Filed: Jul. 25, 2016

(65) Prior Publication Data
US 2016/0337734 A1     Nov. 17, 2016

Related U.S. Application Data

(63) Continuation-in-part of application No. 14/586,281, filed on Dec. 30, 2014, now Pat. No. 9,461,529, which is a continuation-in-part of application No. 13/819,086, filed as application No. PCT/IB2011/053765 on Aug. 28, 2011, now Pat. No. 9,318,940, said application No. 14/586,281 is a continuation-in-part of application No. 13/819,049,
(Continued)

(51) Int. Cl.
| | |
|---|---|
| *H04R 1/02* | (2006.01) |
| *H04R 9/06* | (2006.01) |
| *H04R 9/02* | (2006.01) |
| *H04R 1/24* | (2006.01) |
| *H02K 33/16* | (2006.01) |

(52) U.S. Cl.
CPC ............ *H04R 1/026* (2013.01); *H02K 33/16* (2013.01); *H04R 1/24* (2013.01); *H04R 9/025* (2013.01); *H04R 9/06* (2013.01); *H04R 9/066* (2013.01); *H04R 9/063* (2013.01); *H04R 2201/023* (2013.01); *H04R 2420/07* (2013.01); *H04R 2430/01* (2013.01); *H04R 2460/13* (2013.01)

(58) Field of Classification Search
CPC .... H04R 1/026; H04R 1/02; H04R 2201/023; H04R 9/00; H04R 9/025; A61H 2205/084; A61H 2205/08; A61B 5/6823; A61B 5/6813; A61B 5/6801; A61B 5/6802; A45F 203/045; A45F 203/025
See application file for complete search history.

(56) References Cited

U.S. PATENT DOCUMENTS

| | | | | |
|---|---|---|---|---|
| 5,035,242 A | * | 7/1991 | Franklin | ............... A61F 11/04 607/108 |
| 5,617,477 A | * | 4/1997 | Boyden | .................. H04R 3/12 381/309 |

(Continued)

FOREIGN PATENT DOCUMENTS

| | | |
|---|---|---|
| JP | 2002-078066 | 3/2002 |
| JP | H05-030598 | 8/2006 |

(Continued)

*Primary Examiner* — Md S Elahee
*Assistant Examiner* — Angelica M McKinney
(74) *Attorney, Agent, or Firm* — Robert G. Lev

(57) ABSTRACT

A transducer comprising: a flat strip of metal formed into a closed metal loop with two substantially parallel sides and rounded corners, a solenoid fixed to a surface on a first parallel side, and fixed magnets attached to an opposite parallel side of the trapezoidal shape to bring the fixed magnets into proximity with the solenoid, wherein at least one lateral side of the trapezoidal shape coupling said parallel sides has a continuously varying width, resulting in the transducer being able to resonate with high fidelity over a range of frequencies in response to reception of a signal comprising varying frequencies.

14 Claims, 27 Drawing Sheets

Related U.S. Application Data filed as application No. PCT/IB2011/053233 on Jul. 20, 2011, now Pat. No. 8,995,692.

(60) Provisional application No. 61/378,983, filed on Sep. 1, 2010, provisional application No. 61/427,150, filed on Dec. 24, 2010, provisional application No. 61/452,649, filed on Mar. 15, 2011.

(56) References Cited

U.S. PATENT DOCUMENTS

| | | | | |
|---|---|---|---|---|
| 5,687,244 | A | * | 11/1997 | Untersander .......... H04R 1/025 381/151 |
| 5,708,726 | A | | 1/1998 | Brinkley et al. |
| 6,582,652 | B2 | * | 6/2003 | Craig .................... A61L 31/022 420/112 |
| 6,982,696 | B1 | | 1/2006 | Shahoian |
| 7,023,112 | B2 | | 4/2006 | Miyamoto |
| 7,257,438 | B2 | * | 8/2007 | Kinast ................. A61B 5/6832 600/301 |
| D687,018 | S | * | 7/2013 | Afshar ......................... D14/204 |
| 8,995,692 | B2 | | 3/2015 | Efrati |
| 2003/0012397 | A1 | * | 1/2003 | Gurner ................. H04R 5/023 381/386 |
| 2004/0211799 | A1 | * | 10/2004 | Loughman ............ F16M 13/04 224/262 |
| 2007/0038164 | A1 | * | 2/2007 | Afshar ............... A61H 23/0263 601/47 |
| 2007/0085425 | A1 | | 4/2007 | Hirashima |
| 2007/0126540 | A1 | | 6/2007 | Zimmerling |
| 2007/0160239 | A1 | * | 7/2007 | Fukuda .................. H04R 11/06 381/151 |
| 2007/0179414 | A1 | | 8/2007 | Imboden |
| 2007/0194635 | A1 | | 8/2007 | Miura |
| 2007/0293781 | A1 | * | 12/2007 | Sims .................... A61B 5/1135 600/534 |
| 2008/0129254 | A1 | | 6/2008 | Frayne |
| 2008/0143954 | A1 | | 6/2008 | Abreu |
| 2009/0007458 | A1 | | 1/2009 | Seiler |
| 2009/0105607 | A1 | | 4/2009 | Shahrestani et al. |
| 2009/0111670 | A1 | * | 4/2009 | Williams ........... A63B 23/0464 482/146 |
| 2009/0180646 | A1 | | 7/2009 | Vulfson et al. |
| 2009/0316249 | A1 | | 12/2009 | Kokeguchi |
| 2010/0036297 | A1 | | 2/2010 | Kim |
| 2011/0169347 | A1 | | 7/2011 | Miyamoto |
| 2011/0190058 | A1 | | 8/2011 | Houston et al. |
| 2011/0204653 | A1 | | 8/2011 | Liu |
| 2012/0035515 | A1 | | 2/2012 | Ng |
| 2013/0214913 | A1 | | 8/2013 | Efrati |

FOREIGN PATENT DOCUMENTS

| | | |
|---|---|---|
| JP | HO7-245793 | 9/2007 |
| JP | H10-506033 | 7/2010 |
| WO | WO 2008/156770 | 12/2008 |
| WO | WO 2013/118122 | 8/2013 |

* cited by examiner

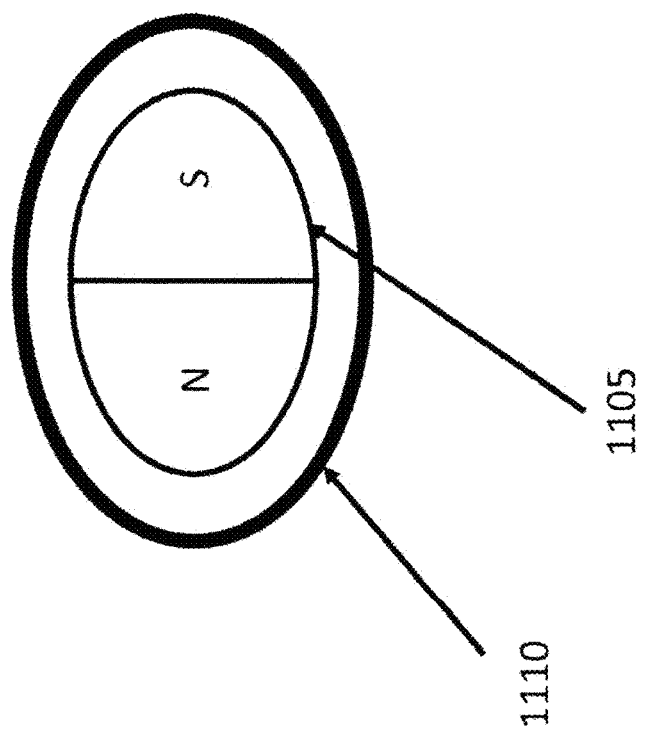

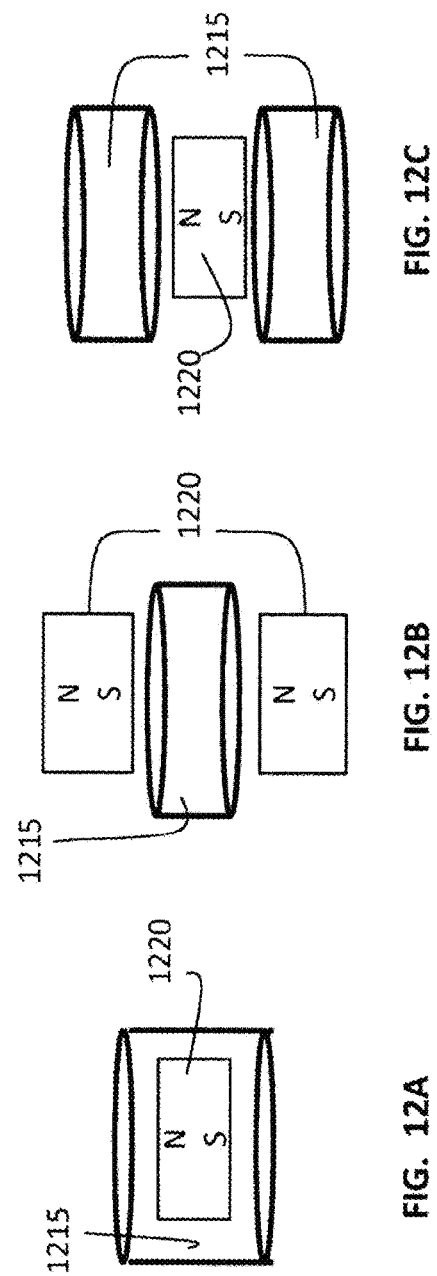

TRANSDUCER HOLDER

PRIORITY INFORMATION

The subject application is a continuation-in-part application of U.S. Ser. No. 14/586,281 filed on Dec. 30, 2014, which, in turn, is a continuation-in-part application claiming priority from U.S. Ser. No. 13/819,086, filed May 7, 2013, and in addition claims priority for additional subject matter to U.S. Ser. No. 13/819,049, filed May 8, 2013. The subject application also claims priority to U.S. Provisional Application No. 61/378,983 filed on Sep. 1, 2010; U.S. Provisional Application No. 61/427,150 filed on Dec. 24, 2010; U.S. Provisional Application No. 61/452,649 filed on Mar. 15, 2011; PCT/IB2011/053233, filed Jul. 20, 2011; and, PCT Application No: PCT/IB2011/053765, filed Aug. 28, 2011.

FIELD AND BACKGROUND OF THE INVENTION

The present invention relates to media systems, more particularly, but not exclusively to a personal media playing system.

Hi-Fi systems adequately reproduce audible frequencies. However, the large variety of personal media playing systems that is available to today's media consumer does not.

Among widely used personal media playing systems are MP3 players, portable DVD players, as well as smart cellular telephones (such as Apple™ iPhone or Samsung™ Galaxy S) that can store and reproduce recorded music or movies.

Current personal media playing systems provide stereo sound to users via conventional earphones and/or small speakers.

In personal systems, the low frequency (bass) components of music is often lost. Although such earphones and small speakers adequately provide vocal and melody (mid frequencies), they do not adequately reproduce lower frequencies which are not picked up by the ear-drum, but rather through the body vibrating, particularly the thorax and diaphragm. Bass signals are highly attenuated and infrasound is not transmitted at all. Consequently, earphones and portable speakers do not provide a satisfactory sensory experience that is analogous to that experienced in a night club, or theater during a live performance by a big orchestra or a rock band.

Conventional bass speakers, commonly known as sub woofers, are large and bulky. Personal music systems, whether small speakers on MP3s and smart-phones, or earphones and earplugs do not provide the bass experience.

In a disco or concert hall, much of the bass is felt through the body rather than through the ears, with some of the signal being transmitted via the floor to the feet.

Sub-sonic vibrations (infrasound), if felt, may provide a spooky sensation. However, such frequencies require very big speakers to reproduce.

There have been various attempts to overcome this problem and to provide an illusion of bass by attaching vibrating devices to the shoes or body of the 'listener'. Such vibrating devices vibrate with the beat of a musical composition, and, when combined with the aural-reception of higher frequencies via earphones or small speakers, provide an enhanced sensation when compared to that of earphones and small speakers without the added sensation from such vibrating devices.

U.S. Pat. No. 6,982,696 to Shahoian describes a moving magnet actuator for providing haptic feedback. The system described has a static solenoid with a W-shaped core about which magnets oscillate. To allow high amplitude of vibration, this arrangement requires high power consumption. The W-shaped core permits a linear relation between magnetic force and displacement, but does not have a smooth attack or recession. The bar magnets have also been found to have a high gradient of magnetic field which also creates preferred harmonics and prevents smooth response at different and changing frequencies. The actuator thus does not provide good sound reproduction, and has poor fidelity.

PCT Application No: PCT/IB2011/053233 filed on Jul. 20, 2011 describes a vibrating transducer that may be fastened to the body or clothing and which enhances the sensation to wearers who additionally receive higher frequencies through earphones. PCT Application No: PCT/IB2011/053765 filed Aug. 28, 2011 describes a wearable transmission device. The base vibrating devices described in these earlier attempts to overcome the inherent limitations of personal music systems are able to follow the beat of some music, and also to differentiate between a range of frequencies and the subject thus has a music experience with the low vibrations sensed through the body. It will be appreciated that the higher the fidelity of the electrical to mechanical signal conversion, the better the sound reproduction.

SUMMARY OF THE INVENTION

The present invention describes a subtle improvement to the devices described in PCT Application No. PCT/IB2011/053233 and PCT Application No. PCT/IB2011/053765 that increases the fidelity of the sound reproduction and which can convert complex waveforms into a dominant vibration and additional vibrations such as harmonics, to provide an enhanced musical experience.

A first embodiment of the invention is directed to a support for a device for holding the device against to a body of a wearer, the support comprising a U shaped open loop having a ventral end that presses on a torso of the wearer, and a dorsal end that presses on a back of the wearer, such that the transducer is attached to one of said ventral and dorsal ends.

Typically, the device is a transducer.

Optionally, the device is attached to the ventral end of the U shaped open loop.

Alternatively, the device is attached to the dorsal end of the U shaped open loop.

Alternatively two devices are attached to a U shaped open loop, such that a first device is attached to a dorsal end and second device is attached to a distal end.

Optionally, a non-slip pad is attached to the dorsal end of the U shaped open loop.

In some embodiments, the non-slip pad comprises a pad of a hook and loop fastener fabric, for example, a Velcro™ pad.

In some embodiments, the U shaped open loop comprises a strip of steel.

Typically, the strip of steel is less than 1 mm thick and less than 20 mm wide.

Typically, the strip of steel comprises a 300 Series stainless steel such as SS 302 or SS 310 for example.

In some embodiments, the transducer is a vibrator.

For some embodiments, the vibrator is configured to provide a bass sensation to music listeners.

In some embodiments, the vibrator is configured to provide a directional tugging.

In some embodiments, the vibrator is configured to provide infrasound to gamers.

In some embodiments, the vibrator comprises of multimedia.

In some embodiments, the vibrator comprises permanent magnets and a solenoid.

In some embodiments, the vibrator comprises a coil and an array of magnets arranged around an axis of the coil, and distanced from the coil, a frame comprising a flat strip of metal formed into a symmetrical trapezoidal shaped closed metal loop having rounded corners, the coil fixed to a first parallel side of the frame, and the array of magnets coupled to an opposite parallel side of the frame a frame, wherein an alternating current in the coil causes the array of magnets to wiggle in a plane about the axis, substantially perpendicular to the axis of the solenoid.

A second aspect of the invention is directed to a method of attaching a device to a torso comprising providing a support for a transducer for holding the device against to a body of a wearer, the support comprising a U shaped open loop having a ventral end that presses on a thorax of the wearer, and a dorsal end that presses on a back of the wearer, such that the transducer is attached to one of said ventral and dorsal ends and attaching the transducer to the wearer.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in order to provide what is believed to be the most useful and readily understood description of the principles and conceptual aspects of the invention. The description taken with the drawings making apparent to those skilled in the art how the several forms of the invention may be embodied in practice.

FIGS. 11B and 11C are simplified block diagrams, schematically and respectively illustrating a top view and a side view of a first vibration transducer, according to an exemplary embodiment of the present invention.

FIGS. 12A, 12B and 12C are simplified block diagrams schematically and respectively illustrating a second, a third, and a fourth vibration transducer, according to exemplary embodiments of the present invention.

FIG. 32 is a flowchart of a method of attaching a transducer to a wearer in accordance with the invention;

DESCRIPTION OF THE PREFERRED EMBODIMENTS

Figure 1:
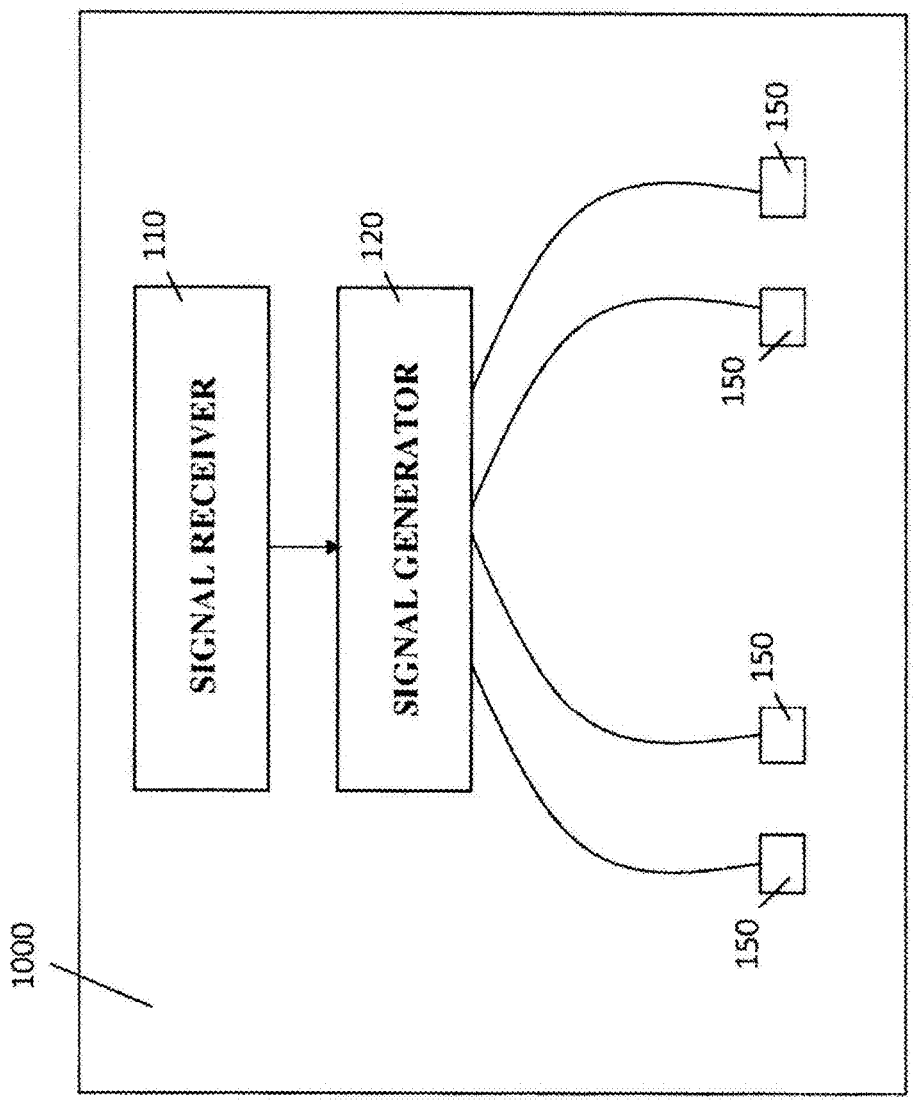
FIG. 1 is a simplified block diagram schematically illustrating a first apparatus for personal media playing, according to an exemplary embodiment of the present invention.

The present embodiments comprise an apparatus and a method for personal media playing.

According to an exemplary embodiment of the present invention, there is received a media signal, say an audio signal of a piece of music or of a soundtrack of a movie, a signal of a video clip encoded in an MP4 format, a video stream, etc.

Then, there are derived two or more signals, say low frequency signals, from the media signals. The derived signals may be similar, or different from each other. Each of the derived signals is destined for a specific body area of the user, as described in further detail hereinbelow.

In one embodiment of the present invention, each of the derived signals is tailored for the specific body area of a user, which the derived signal is destined for, say using a dedicated processor chip, as described in further detail hereinbelow.

For example, one of the signals derived from the media signal, may be tailored for a specific body area in which bone is close to skin (say one of the legs), whereas another one of the derived signals may be tailored for a more fleshy body area, such as the waist, as described in further detail hereinbelow.

The tailoring may include insertion of a certain signal sequence into the signal derived from the media signal, changing the derived signal's waveform, compressing certain parts of the derived signal, etc., as described in further detail hereinbelow.

Each of the tailored signals is transmitted to one or more vibration devices (also referenced hereinbelow as 'vibration transducers'), deployed on the specific body area that the signal is tailored for, as described in further detail hereinbelow.

Consequently, each of the vibration devices vibrates on the specific body area, according to the signal tailored for the specific body area.

In another embodiment, each of the signals derived from the media signal is destined for a specific body area. However, the derived signal is transmitted unchanged to one or more vibration devices deployed on the specific body area of the user. Upon receiving the transmitted low frequency signal, the vibration device vibrates on the body area, in a manner optimal for the body area. The vibration device vibrates in the manner optimal for the body area, say by virtue of a vibration device design optimal for the specific body area, or due to a signal tailoring capacity embedded in the vibration device itself (say using a dedicated electric circuit for signal processing), as described in further detail hereinbelow.

In a yet another embodiment, each one of the derived signals is tailored specifically for the specific body area, and sent to the vibration devices deployed on the specific body area.

The vibration device applies area specific vibrations on the body area, by virtue of the specific tailoring, a vibration device design made optimal for the specific body area, or both.

That is to say that the tailoring of the derived signal and the design of the vibration device may serve together, to optimize the vibrations applied on the specific body area, as described in further detail hereinbelow.

A method according to an exemplary embodiment of the present invention may be used with media items mixed specifically for the method. However, the tailoring of the signals, may add a new user experience to millions of currently available media items, such as video clips or movie soundtracks, using the media as originally recorded.

That is to say that legacy media items originally mixed for traditional platforms, say a standard stereo system, or a regular MP3 Driver, need not be modified or mixed again (with additional channels or a modified distribution of recording channels), by the media's producer, for at least some of the present embodiments to work.

Low frequency signals derived or tailored according to some exemplary embodiments of the present invention, are typically signals with frequencies that the human ear is much less sensitive to, whereas other parts of the human body are much more sensitive to.

For example, the human ear experiences a gradual decrease in hearing, below a frequency range of 220-250 Hz. Low frequency signals below the range of 220-250 Hz may thus be tailored for specific body areas, according to some embodiments of the present invention. Of special interest are lower frequency signals, such as infrasonic signals that are characterized by a frequency lower than 20 Hz, which is usually below limits of human hearing.

Based on the tailored low frequency signals, low frequency (or even infrasonic) vibrations applied on to a user's body, may generate low frequency sensations such as quakes, thumping, shaking, earthquake-like sensations, movement sensations, composite sound and vibration related sensations, etc., as described in further detail hereinbelow.

The principles and operation of an apparatus and a method, according to the present invention may be better understood with reference to the drawings and accompanying description.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

Reference is now made to FIG. 1, which is a simplified block diagram schematically illustrating a first apparatus for personal media playing, according to an exemplary embodiment of the present invention.

An exemplary apparatus 1000, for personal media playing, according to an exemplary embodiment of the present invention, may be implemented as hardware, or as a combination of hardware and software.

The apparatus 1000 (or at least some parts of the apparatus) may be worn by a user of the apparatus 1000, as described in further detail hereinbelow.

The apparatus 1000 includes a signal receiver 110.

The signal receiver 110 receives a media signal, say of a soundtrack of a movie, a video clip played on an MP3 player, a video stream, etc.

The signal receiver 110 receives the media signal from an audio source, such as an MP3 Player (say through the player's headphone socket), a computer, a game console, a media reader such as a CD-ROM or a DVD (Digital Video Disc) drive, a smart phone (say Apple™ i-Phone), etc., as known in the art.

The signal receiver may 110 receive the media signal through a wireless connection to the audio source, through a wired connection to the audio source, through a socket such as a USB Socket of the audio source, or through any combination thereof, as described in further detail hereinbelow.

The apparatus 1000 further includes a signal generator 120, in communication with the signal receiver 110.

Optionally, the signal generator 120 is implemented on a dedicated Digital Signal Processing (DSP) chip, on a desktop computer, on a laptop computer, on a mobile smart phone, etc., as known in the art.

The signal generator 120 derives two or more, signals from the media signal received by the signal receiver 110. The derived signals may be similar, or different from each other.

Optionally, the derived signals are low frequency signals. The low frequency signals are signals with frequencies that the human ear is much less sensitive to, whereas other parts of the human body are much more sensitive to (say through touch).

The signal generator 120 tailors each of the derived signals for a respective one of a plurality of body areas of a user of the apparatus 1000, as described in further detail hereinbelow.

Optionally, the signal generator 120 derives the signals for a preset number of body areas, say a number preset by a user or a manufacturer of the apparatus 1000, whereas the media signal's recording may be based on a different number of channels.

In one example, the media signal originates from a hand held stereo media player with two channels, and the signal generator 120 derives eight channels from the media signal, for eight body 10 areas of a user.

In the example, the signal generator 120 may tailor one of the derived signals for a specific body area in which bone is close to skin (say one of the legs), while tailoring another one of the derived signals for a more fleshy body area, such as the waist, as described in further detail hereinbelow.

The apparatus 1000 further includes two or more vibration devices 150, in communication with the signal generator 120, through a wired or wireless connection, and wear by the user of the apparatus 1000.

Optionally, at least one of the vibration devices 150 is wireless and the signal generator 120 communicate with the vibration device 150 through a wireless connection, using one wireless 20 communication frequency. Alternatively, the signal generator 120 communicates with the vibration device 150 using more than one wireless communication frequency, say when many users use similar apparatuses 1000 close to each other.

In some embodiments, the wireless connection is a limited range connection, with a useful range of 5-6 meters, or even 2-3 meters. In some other embodiments, the wireless connection is a 25 limited range connection, with a useful range of 10-20 meters, or 30 meters.

Each one of the vibration devices 150 (or a sub-group of the vibration devices 150), may be deployed on a respective one of the body areas of the user, and vibrate on the body area, according to the signal tailored for the respective body area.

The tailoring of the derived signals may include one or more of a variety of signal manipulations.

The signal manipulations may include, but are not limited to: insertion of a certain signal sequence into the derived signal, changing the derived signal's waveform, compressing certain parts of the derived signal, filtering and equalization of specific frequency ranges, introduction of delays among signals derived from the media signal, for different body areas, etc., as described in further detail hereinbelow.

That is to say that the signal generator 120 may optimize each of the tailored signals for a specific body area, as described in further detail hereinbelow.

Optionally, the signal generator 120 tailors the signal derived from the media signal, with a waveform optimal for the body area.

For example, the signal generator 120 may tailor a derived signal destined for one of the user's hands, with an asymmetric waveform characterized by a relatively rapid elevation (also referred to as an attack) of amplitude, and a relatively slow decay of the amplitude, or vise versa.

Consequently, upon application of vibrations based on the signal tailored with the asymmetric waveform, on the user's hand, there is generated a movement-like sensation on the user's hand, as described in further detail hereinbelow. Further, the movement-like sensation is likely to cause the user to respond with a real feed-back movement, in a direction opposite the movement-like sensation (for a pushing sensation) or in the sensation's direction (for a pulling sensation).

Optionally, the signal generator 120 tailors the signal derived from the media signal, with a frequency, or a frequency range, optimal for the body area to which the signal is destined, as described in further detail hereinbelow.

Optionally, the signal generator 120 tailors the signal derived from the media signal, by inserting a predefined sequence to the derived signal.

For example, the signal generator 120 may insert a specific signal sequence stored in a dedicated database of vibration effects (say a sequence typical of a boom effect) to the derived signal, whenever the signal generator 120 identifies a predefined sequence (say a sound typical of an explosion) in the media signal.

Optionally, the signal generator 120 tailors the derived signals, so as to simulate a specific environment, such as an open air environment, a closed hall environment, a car with powerful low frequency speakers, an environment with a wood floor, an environment with a concrete floor, etc.

For example, the signal generator 120 may insert a sequence of floor vibrations to the derived signal.

Optionally, the signal generator 120 is preconfigured with specific amplifications, delays or phase differences, based on measurements made on a user's body locations during a live sound experience in a specific environment. The signal generator 120 may tailor the derived signals for the specific environment, using the specific amplifications, delays or phase differences, as measured in the specific environment.

Optionally, the user of apparatus 1000 is allowed to select one the environments, say using a control panel, for the signal generator 120 to tailor the derived signals for, as described in further detail hereinbelow.

The media signal may be a signal produced upon playing of a standard, one of millions of currently available media items, such as music clips, video clips, or movie soundtracks.

That is to say that the signal generator 120 may tailor the derived signals, using the media item as originally recorded.

No need for a producer of the media item, to re-mix the media with special vibration channels or with a new distribution among recording channels, or to provide a complement mix of vibration channels, in order for the current apparatus 1000 to work.

That is to say that media items originally mixed for traditional platforms, such as a standard stereo system or a regular MP3 Driver, need not be modified or remixed, for the exemplary apparatus 1000 to work.

Optionally, the vibration device 150 vibrates on the body area, in a manner optimal for the body area.

For example, the vibration device 150 may vibrate in direction optimal for the body area.

In the example, the vibration device 150 may vibrate in a direction which best suits the specific body area that the vibration device 150 is deployed on, say in a direction perpendicular to a fleshy body area of a wearer the apparatus 1000, or transversely to a boney body area of the wearer, as describe in further detail hereinbelow.

Optionally, the vibration device 150 itself further includes a signal tailoring capacity (say a dedicated electric circuit for signal processing, or a frequency selective amplifier), as described in further detail hereinbelow.

Using the signal tailoring capacity, the vibration device 150 may further tailor the tailored signal for the specific area, as received by the vibration device 150, say by further changing the received signal's waveform or by amplifying only parts of the signal that are in a low frequency range, as described in further detail hereinbelow.

Optionally, the signal generator 120 further introduces a phase difference between at least two signals derived and tailored for different body areas of the user, say for generating a sensation which moves up from a lower body area to a higher body area, or vise versa.

Optionally, the signal generator 120 further uses control data embedded in the received media signal in accordance with a predefined protocol, for tailoring the derived signals. For example, the signal generator may introduce a certain signal sequence to the signal derived from the media signal, upon identifying a certain tone in the media signal received by the signal receiver 110, as described in further detail hereinbelow.

Optionally, the apparatus 1000 further includes a control panel, say a set switches or a touch screen, in communication with the signal generator 120.

The control panel provides a user interface which may be operated by a user of the apparatus 1000, for controlling the signal generator 120.

The user may use the control panel for adjusting the amplitude of a signal tailored for a specific body area (say the user's chest), thereby moderating the vibrations felt on the user's chest, adjust the amplitude of the tailored signals in general, etc., as described in further detail hereinbelow.

Optionally, the apparatus 1000 further includes an audio signal generator (not shown), in communication with the signal receiver 110.

The audio signal generator derives an audio signal from the received media signal, thus reproducing at least a part of the media signal, for the user to hear.

Optionally, the audio signal generator forwards the audio signal derived from the media signal to a loudspeaker, or to headphones, used by the user who wears the apparatus 1000.

For example, the audio signal generator may identify audio signals in an MP4 media signal, and forward the identified audio signals to a loudspeaker, or to headphones, as described in further detail hereinbelow.

Figure 2:
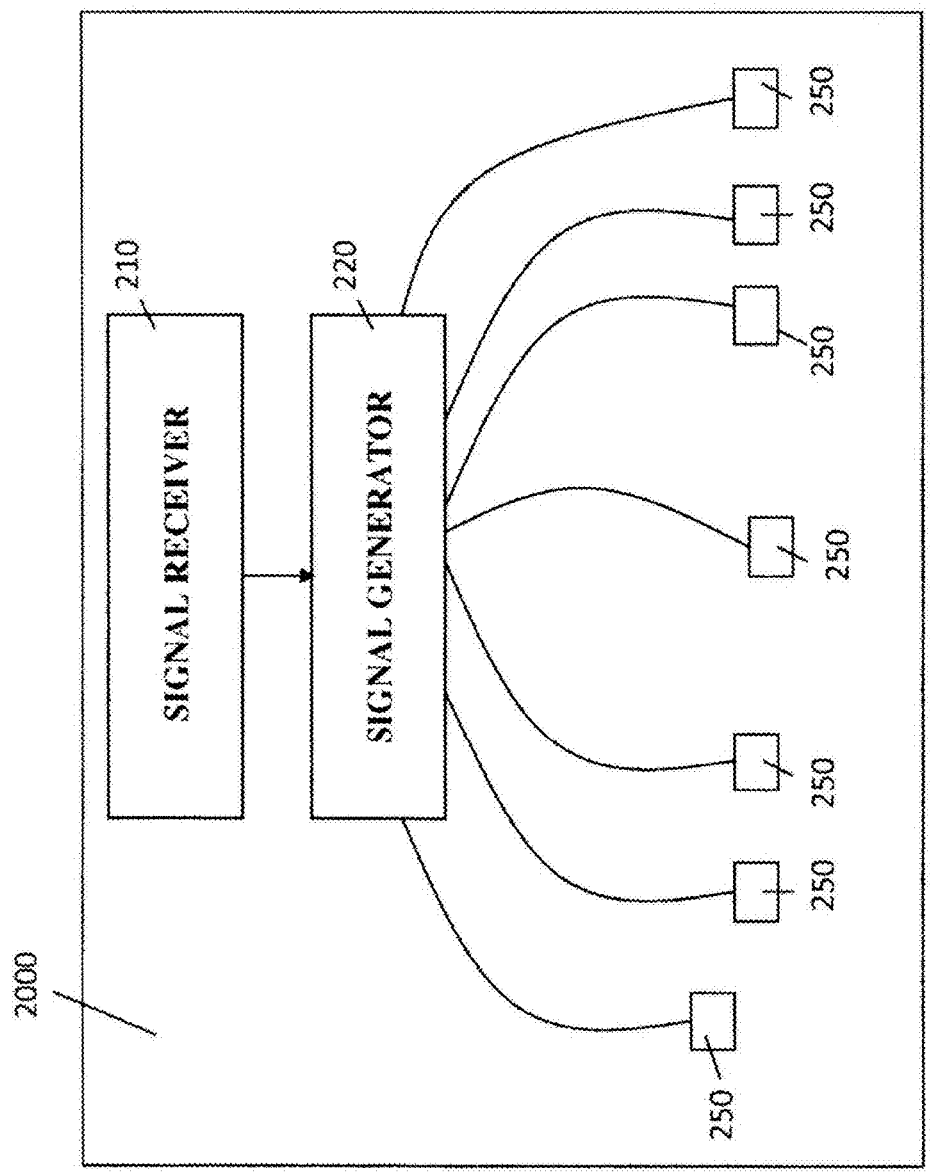
FIG. 2 is a simplified block diagram schematically illustrating a second apparatus for personal media playing, according to an exemplary embodiment of the present invention.

Reference is now made to FIG. 2, which is a simplified block diagram schematically illustrating a second apparatus for personal media playing, according to an exemplary embodiment of the present invention.

An exemplary apparatus 2000, for personal media playing, according to an exemplary embodiment of the present invention, may be implemented as hardware, or as a combination of hardware and software.

The apparatus 2000 (or at least some parts of the apparatus) may be worn by a user of the apparatus 2000, as described in further detail hereinbelow.

The apparatus 2000 includes a signal receiver 210.

The signal receiver 210 receives a media signal, such as a music clip, a soundtrack of a movie, a video clip, a soundtrack of a computer game, a video stream, etc.

The signal receiver 210 receives the media signal from an audio source, such as an MP3 Player (say through the player's headphone socket), a computer, a game console, a media reader such as CD-ROM or a DVD (Digital Video Disc) drive, a smart phone (say Apple™ i-Phone), etc., as known in the art.

The signal receiver may 210 receive the media signal through a wireless connection to the audio source, through a wired connection to the audio source, through a socket such as a USB Socket of the audio source, or through any combination thereof, as described in further detail hereinbelow.

The apparatus 2000 further includes a signal generator 220, in communication with the signal receiver 210.

Optionally, the signal generator 220 is implemented on a dedicated Digital Signal Processing (DSP) chip, on a desktop computer, on a laptop computer, on a mobile smart phone, etc., as known in the art.

The signal generator 220 derives a signal from the received media signal.

Optionally, the derived signals are low frequency signals. The low frequency signals are signals with frequencies that the human ear is much less sensitive to, whereas other parts of the human body are much more sensitive to (say through touch).

The apparatus 2000 further includes two or more vibration devices 250, in communication with the signal generator 220, through a wired or wireless connection, and wear by the user of the apparatus 2000.

Optionally, at least one of the vibration devices 250 is wireless and the signal generator 220 communicate with the vibration device 250 through a wireless connection, using one wireless communication frequency. Alternatively, the signal generator 220 communicates with the vibration device 250 using more than one wireless communication frequency, say when many users use similar apparatuses 2000 close to each other.

In some embodiments, the wireless connection is a limited range connection, with a useful range of 5-6 meters, or even 2-3 meters. In some other embodiments, the wireless connection is a 10 limited range connection, with a useful range of 10-20 meters, or 30 meters.

One of vibration devices 250 (or a sub-group of the vibration devices 250), may be deployed on a specific one of the body areas of the user, and vibrate on the specific body area, according to the derived signal, in a manner optimal for the specific body area.

For example, the vibration device 250 may vibrate in a direction which best suits the specific body area that the vibration device 250 is deployed on, say in a direction perpendicular to a fleshy body area of a wearer the apparatus 2000, or transversely to a boney body area of the wearer, as describe in further detail hereinbelow.

The vibration device 250 vibrates in a manner optimal for the specific body area that the vibration device 250 is deployed on, due to a vibration device design optimal for the specific body area, as describe in further detail hereinbelow.

Optionally, the vibration device 250 further includes a signal tailoring capacity (say a dedicated electric circuit for signal processing, or a frequency selective amplifier), as described in further detail hereinbelow.

Using the signal tailoring capacity, the vibration device 250 may tailor the derived signal for the specific area, as received by the vibration device 250, say by changing the received signal's waveform or by amplifying only parts of the derived signals that are in a low frequency range.

That is to say that the vibration device 250 may apply the vibrations in a manner optimal for the specific body area, by virtue of a vibration device design made optimal for the specific body area, a tailoring capacity embedded in the vibration device 250, or both.

Optionally, the apparatus 2000 further includes a control panel, say a set switches or a touch screen, in communication with the signal generator 220.

The control panel provides a user interface for the user, to control the signal generator 220, say for adjusting the amplitude of the derived signal in general.

Optionally, the user may also use the control panel, for adjusting the derived signal's amplitude as sent to a vibration device positioned on a specific body area, say the user's chest, thereby moderating vibrations felt on the specific body area, as described in further detail hereinbelow.

Optionally, the apparatus 2000 further includes an audio signal generator (not shown), in communication with the signal receiver 210.

The audio signal generator derives an audio signal from the received media signal, thus reproducing at least a part of the media signal, for the user to hear.

Optionally, the audio signal generator forwards the audio signal derived from the media signal to a loudspeaker, or to headphones, used by the user who wears the apparatus 2000.

For example, the audio signal generator may identify audio signals in an MP4 media signal, and forward the identified audio signals to a loudspeaker, or to headphones, as described in further detail hereinbelow.

Figure 3:
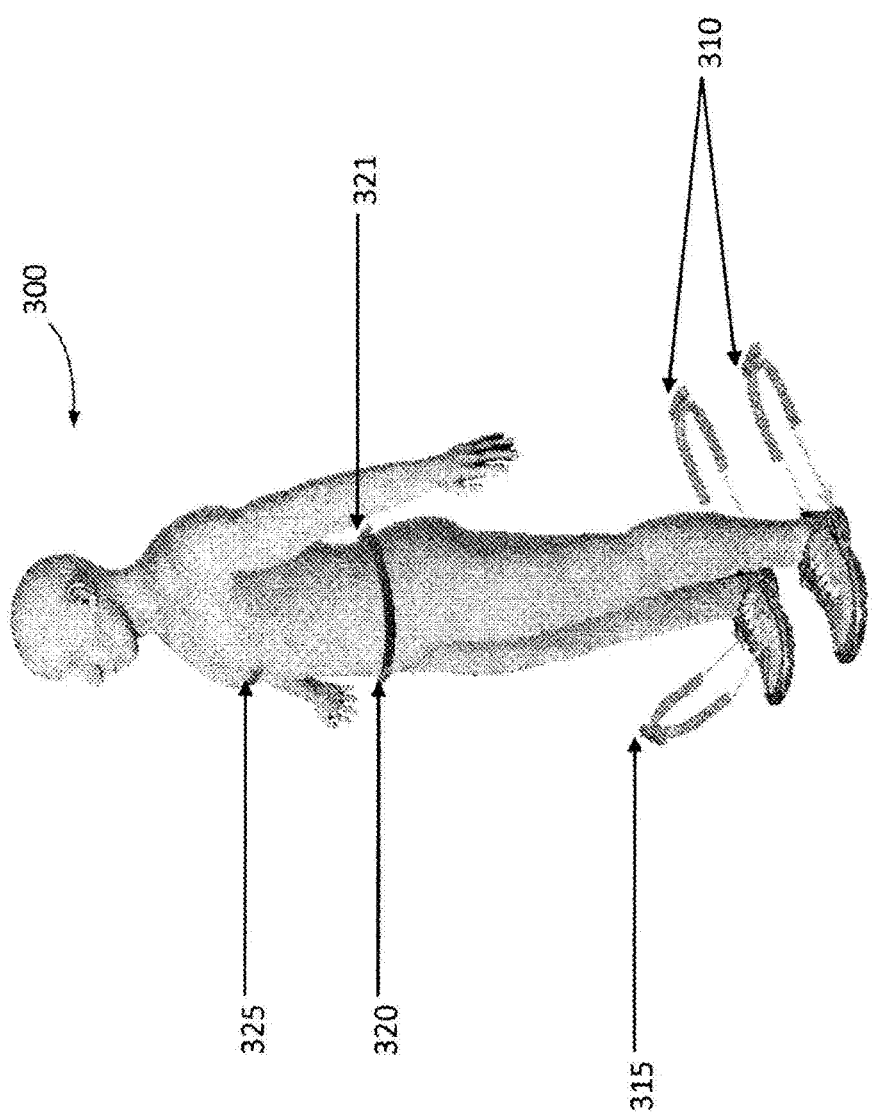
FIG. 3 is a simplified block diagram schematically illustrating a third apparatus for personal media playing, according to an exemplary embodiment of the present invention.

Reference is now made to FIG. 3, which is a simplified block diagram schematically illustrating a third apparatus for personal media playing, according to an exemplary embodiment of the present invention.

A third exemplary apparatus, according to an exemplary embodiment of the present invention, includes several units wear by a person 300.

Each unit houses one or more vibration device(s), say one of the exemplary vibration devices (also referred to hereinbelow, as 'vibration transducers'), described in further detail hereinbelow.

FIG. 3 is brought here to illustrate one exemplary way for a person to use an apparatus, according to an exemplary embodiment of the present invention, and to illustrate possible portability of the apparatus as well as a possible personal sound experience provided by the apparatus, as opposed to a sound experience in a club.

Note that the person 300 is not shown wearing headphones, although some embodiments of the present invention do include an audio connection for headphones.

The person 300 is depicted wearing an exemplary pair of a first type of a foot vibration device 310, intended to fit around a sole of the person's shoe and produce vibrations according to low frequency signals sent to the foot vibration device 310, as described in further detail below.

The person 300 is also depicted wearing a second type of a foot vibration device 315, intended to fit on top of the person's shoe. The second type of foot vibration device 315 is also used in a pair, though only one is shown in FIG. 3, for simplicity of depiction.

The first type of a foot vibration device 310 and the second type of a foot vibration device 315 are not normally used together. Both are depicted in FIG. 3, for illustrative purposes only.

In some embodiments of the present invention, the foot vibration devices are designed to attach to a foot with an elastic band (not shown), to an elastic sock (not shown), etc.

In some embodiments of the present invention, foot vibration devices are designed to be located next to a foot by being produced as an under-the-foot shoe insert (not shown) similar to an orthopedic insert.

The person 300 is depicted wearing a waist vibration device 320, intended to produce vibrations according to low frequency signals sent to the waist vibration device 320, as described in further detail hereinbelow.

The person 300 is depicted wearing another waist vibration device 321. In some embodiments of the present invention, two or more waist vibration devices are used. In other embodiments, only one waist vibration device 321 is used, and the waist vibration device 321 may be placed at different locations around the waist.

The person 300 is depicted wearing a chest vibration device 325, intended to produce vibrations according to low frequency signals sent to the chest vibration device 325, as described in more detail hereinbelow. The chest vibration device 325 is optionally deployed next to the sternum, or chest bone.

According to some embodiments of the present invention, a vibration device is deployed on a high sensitivity body area, such as the tail bone (coccyx) or another spine area, for imparting vibration sensations on the high sensitivity body area.

According to some embodiments of the present invention, the vibration devices may be deployed on body areas selected according to user preferences, known body acoustic meridians and pressure locations, etc.

In some of the embodiments, an area specific vibration is imparted to each respective area among carefully selected body areas of a user.

The vibration may have area-specific characteristics such as a specific direction (say in a specifically selected angle to the body surface), a position specific waveform, etc., as described in further detail hereinbelow.

An additional body area which may be used is the back, optionally against the spine, say in a position directly opposite the user's chest.

According to some embodiments of the present invention, the user picks and chooses which body part to use for experiencing the vibrations. By way of a non-limiting example, the user may choose to go without the foot vibration device while jogging.

Figure 4:
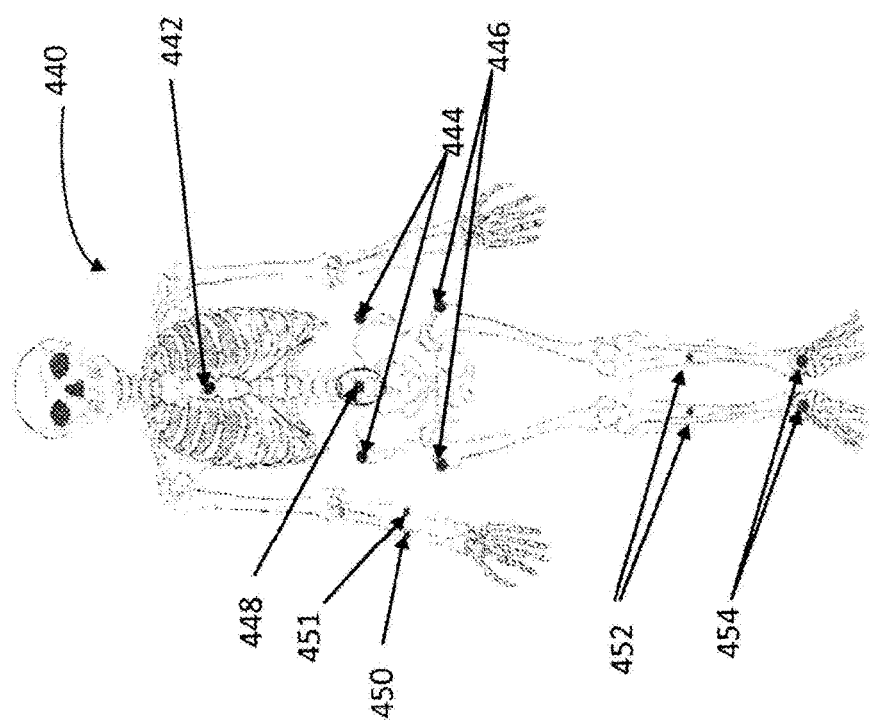
FIG. 4 is a simplified diagram schematically illustrating possible body areas, for placing vibration devices, according to an exemplary embodiment of the present invention.

Reference is now made to FIG. 4, which is a simplified diagram schematically illustrating possible body areas for placing vibration devices, according to an exemplary embodiment of the present invention.

FIG. 4 depicts some exemplary locations for placing vibration devices with relation to the human skeleton 440, according to an exemplary embodiment of the present invention.

It is noted that FIG. 4 is not meant to imply that advantageous locations for placing vibration devices are limited to body areas close to, or pressing on the skeleton 440.

Optionally he vibration device are positioned along selected body acoustic meridians. In body areas along the selected meridians, the human body senses vibrations in a manner which contributes to a real, whole body, sensation of low frequency sound when produced with vibration devices of exemplary embodiments of the present invention, as described in further detail hereinbelow.

The exemplary areas include, but are not limited to: the sternum 442; the spine, just behind the sternum (not shown); the top of the pelvis 444; the top of the femurs 446; the lower back 448; close to the radius 450 and/or the ulna 451, on one or both hands (left hand locations not shown in FIG. 4); close to the tibia 452; and at the ankles 454.

Figure 5:
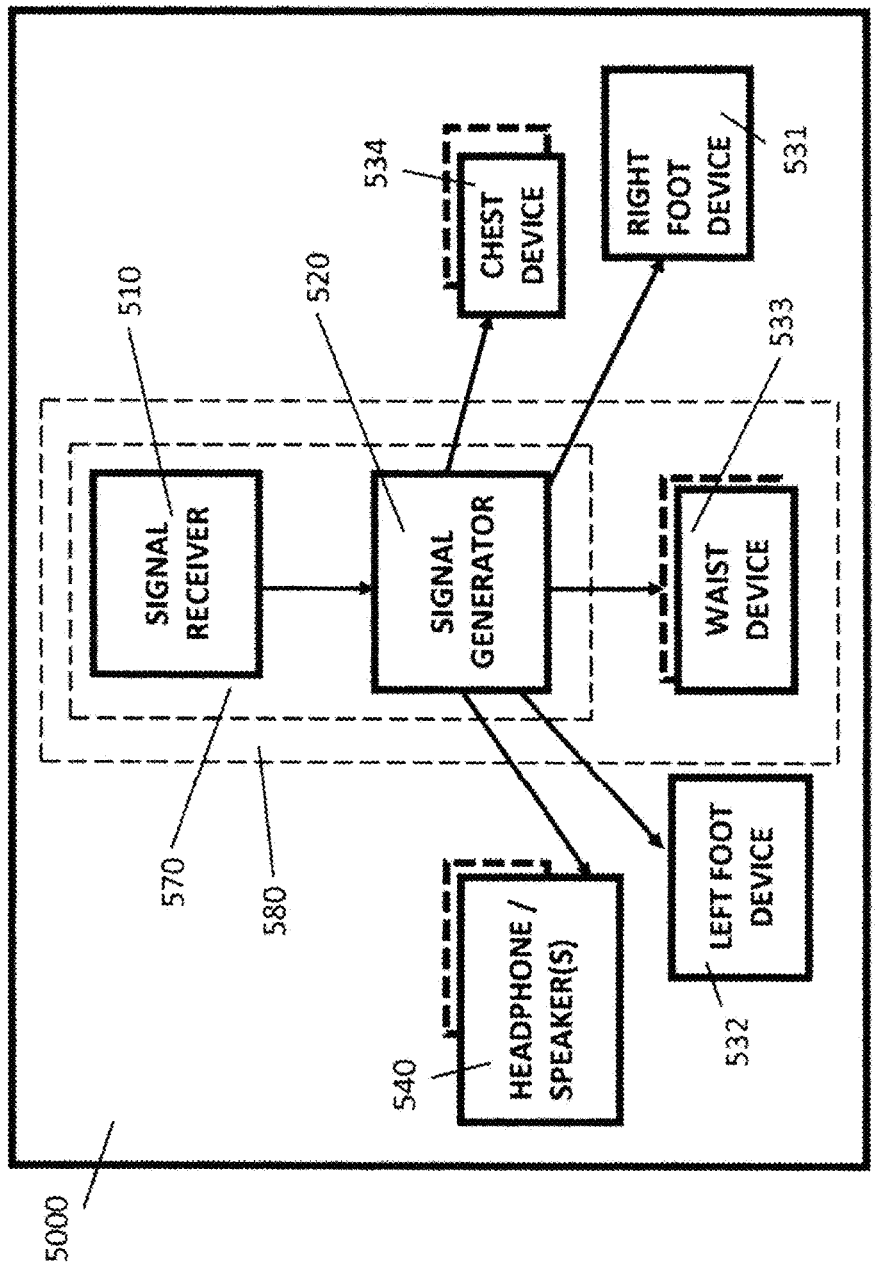
FIG. 5 is a simplified block diagram schematically illustrating a fourth apparatus for personal media playing, according to an exemplary embodiment of the present invention.

Reference is now made to FIG. 5, which is a simplified block diagram schematically illustrating a fourth apparatus for personal media playing, according to an exemplary embodiment of the present invention.

An exemplary fourth apparatus 5000 is a wearable apparatus which includes a media signal receiver 510, a signal generator 520, and several vibration devices 531-534, as described in further detail hereinabove.

The vibration devices 531-534 may include, but are not limited to one or more of the following: a right foot vibration device 531, a left foot vibration device 532, one or more waist vibration devices 533, and one or more chest vibration devices 534.

The apparatus 5000 may further include an audio signal generator (not shown), as well as one or more headphone(s) or speaker(s) 540, so as to allow a wearer to hear audio signal simultaneously to application of vibrations on the wearer's body, as described in further detail hereinbelow.

In some embodiments, the media signal receiver 510 includes a dumb connector to a source of sound signals. The source may include either only a low frequency channel or both a low frequency channel and one or more normal bandwidth audio channels. The dumb connector may be to a signal output of a media drive (say a headphone socket), or to another analog, digital, metallic wire, optical, or other signal output.

In some embodiments, the media signal receiver 510 includes a wireless receiver, which receives a transmission of sound signals from a wireless transmitter.

In some embodiments, the media signal receiver 510 includes a microphone which picks up ambient sound. In some embodiments, the media signal receiver 510 filters out higher frequency sound signals and passes only lower frequencies.

In some embodiments, the media signal receiver 510 splits higher frequency sound signals to pass along to headphones, and lower frequencies to pass along to the signal generator 520.

In some embodiments, the media signal receiver 510 includes a microphone which picks up ambient sound, and uses the picked ambient sound, to remove ambient noise from the sound signal.

In some embodiments, the media signal receiver 510 includes a microphone which picks up ambient sound, and optionally adds the ambient noise to the sound signal.

In some embodiments, the media signal receiver 510 includes a microphone for low frequency pickup.

In some embodiments, the media signal receiver 510 includes an actual source of sound signals, such as, by way of a non-limiting example, a personal audio player, a radio receiver, and so on.

The media signal receiver 510 may include either only a low frequency channel or both a low frequency channel and one or more normal bandwidth audio channels.

In some embodiments, the low frequency channel is a standard LFE (Low Frequency Effects) channel, as known in the art.

In some embodiments, the media signal receiver 510 provides a pass-through to the low frequency channel or channels described hereinabove. In some embodiments, the media signal receiver 510 filters low frequencies from the received sound signal.

The media signal receiver 510 is connected to the signal generator 520, and forwards the received sound signals or low frequency parts thereof to the signal generator 520.

The signal generator 520 derives low frequency signals from the signal(s) received from the media signal receiver 510, and tailors each of the derived low frequency signals for a specific area on a user's body.

In the instant example, the signal generator tailors the low frequency signals for the waist, chest, right foot and left foot, on which the vibration device 531-534 are deployed, as described in further detail hereinabove.

Then, the signal generator 520 sends the tailored signals to, respective vibration devices 531-534.

Optionally, the signal generator 520 produces coordinated low frequency signals tailored for inducing location-specific vibrations at a plurality of locations on a user's body.

In some embodiments, the signal generator 520 filters low frequencies from the signals provided by the media signal receiver 510.

In some embodiments, the signal generator 520 does not filter low frequencies from signals provided by the media signal receiver 510.

Optionally, the vibration devices 531-534 accept unfiltered signal and amplifiers inside the vibration devices 531-534 filter and amplify only low frequency signals. Alternatively, the vibration devices' amplifiers amplify all non-filtered signals, and the vibration devices 531-534 vibrate at low frequency, by virtue of the devices' 531-534 mechanical response, as described in further detail hereinbelow.

Each of the connections between the signal receiver 510 and the signal generator 520, and between the signal generator 520 and each of the vibration devices 531-534, may be wireless or rather wired, as known in the art.

In some embodiments, for the connections which are wireless, the signal generator 520 includes a mechanism for optional switching between different RF frequencies.

Optionally, each of the vibration devices 531-534 is designed to impart low frequency vibration to the specific body area, on which the vibration device is deployed, as described in further detail hereinbelow.

Optionally, at least one of the vibration devices has a characteristic optimized for the specific body area on which the vibration device is deployed. For example, the vibration device may vibrate in a direction optimal for the specific body area, as described in further detail hereinbelow.

The headphone/speaker units 540 are designed to impart normal, full bandwidth sound to one or more standard headphones and/or speakers.

Each of the waist vibration devices 533 is optional, and some embodiments do not include waist vibration devices 533 at all.

In some embodiments, the one or more waist vibration devices 533 are designed for attachment to an article of clothing wear on the waist area, such as a belt, trousers, a skirt, and so on.

In some embodiments, the waist vibration devices 533 are designed for attachment to the waist area by a strap, similar to a heart beat monitor. In some embodiments, the strap may be a rubber or silicone strap, say a strap similar to a pulse rate monitor strap. In some embodiments, the waist vibration devices 533 are designed to be built into a belt.

In some embodiments, vibrations imparted by the waist vibration devices 533, are directional vibrations in a direction optimized for the area of the waist, say in a direction transverse to the surface of the body or skin, of the wearer, as describe in further detail hereinbelow.

Each of the chest vibration devices 534 is optional, and some embodiments do not include the chest vibration devices 534 at all. In some embodiments, the chest vibration devices 534 are designed for attachment to an article of clothing wear on the chest area, such as a shirt, a jacket, an undershirt, a bra, a strap, and so on.

It is noted that the chest vibration devices 534 may be recommended for high audio volume environment such as a live stage. When used in high noise surroundings such as live performances, the chest vibration devices 534, and optionally also the waist vibration devices 533, may be attached more tightly to a wear's body. The chest vibration devices 534 may be attached to the wear's body, using one or more of a strap, a belt, an adhesive strap, a semi-rigid adhesive strap, a loop and hook attachment such as a Velcro™ strap, etc., as known in the art.

In some embodiments, the media signal receiver 510 and the signal generator 520 are packaged together in one unit 570.

In some embodiments, the media signal receiver 510, the signal generator 520, and one or more of the waist vibration devices 533 are packaged together in one unit 580.

In some embodiments, the media signal receiver 510, the signal generator 520, and one of the chest vibration devices 534 are packaged together in a single unit (not shown).

In some embodiments, the media signal receiver 510, the signal generator 520, and one of the foot vibration devices 531, 532, are packaged together in a single unit (not shown). Optionally, the one unit is a shoe unit, which is optionally built into a shoe, rather than attached onto the shoe.

Each of the parts of the apparatus 5000 may require a source of electrical energy.

The sources of electrical energy may be a battery which may be either regular or rechargeable. Additional methods of providing electrical energy to parts of the apparatus 5000 include, but are not limited to: using a person's movements to generate electrical energy, using induction coils that receive energy radiated from an energy transmitter, or using rechargeable batteries, say with large capacitors, etc.

Additional methods of providing energy to the parts of the apparatus 5000 may include storing and releasing mechanical energy, such as winding and releasing a mechanical spring (not shown).

According to some exemplary embodiments of the present invention, vibrations applied by different ones of the vibration devices 531-534, on each specific body area, may have area-specific characteristics.

The area specific characteristics may include, but are not limited to: a specific direction, say in a specifically selected angle to the body surface, a vibration phase which changes among different body areas, an areas specific waveform, etc., as described in further detail hereinbelow.

For example, transverse vibrations are typically felt in fleshy locations as less localized than perpendicular vibrations, and aid the brain in producing a whole body vibration sensation.

Perpendicular vibrations are typically felt in fleshy locations as more localized, and not spread out.

In some body areas, typically near bone, perpendicular vibrations are felt as being less localized and more spread out.

Consequently, each of the vibration devices of the present invention, may be designed for applying vibrations in a direction transverse to the wearer's body surface, or skin, or at a substantially oblique angle across the wearer's body surface or skin, according to the vibration device's intended body area of deployment.

That is to say that the particular design and arrangement of the vibration devices may serve to optimize the vibrations for the specific body area, as described in further detail hereinbelow.

With conventional methods, in order to help the brain get a whole-body sensation, vibrations have to be imparted to a body area as large as possible.

By contrast, with an exemplary embodiment of the present embodiments, there is imparted a specific vibration to each respective area among carefully selected areas of a user's body. The vibration may have position-specific characteristics such as a specific direction (say in a specifically selected angle to the body surface), a position specific waveform, etc., as described in further detail hereinbelow. Consequently, a small number of vibration devices may generate a whole-body sensation.

For example, the foot vibration devices 531, 532 of apparatus 5000, may generate a vibration in a direction perpendicular to the bone. In boney areas, perpendicular vibrations are felt as being less localized and more spread out, as described in further detail hereinabove.

Consequently, the vibrations imparted on the foot, say on the foot's sole, may help simulate a real life effect of a vibrating environment on the whole foot.

As, the feet supply much of the vibration sensation for the brain, vibrations imparted on the feet together with vibrations applied on the waist, may provide a substantially sufficient vibration sensation for the brain to provide a whole-body sensation.

In some embodiments, the signal generator 520 tailors the low frequency signals with a waveform shaped for inducement of vibrations that emulate movement like sensations, such as the sensations felt in an open air theater, a closed dance club, a car having powerful bass speakers, and so on.

For example, the signal generator 520 may tailor the law frequency signal, so as to apply a vibration of an asymmetric saw tooth waveform, on the body area on which the vibration device is deployed. Consequently, a directional sensation is felt by the brain of the user.

In another example, the signal generator 520 tailors the law frequency signal, so as to apply a vibration of a waveform alternating between two or more asymmetric saw tooth (or other) patterns on the body area on which the vibration device is deployed. Consequently, a directionally changing sensation is felt by the brain of the user.

In some embodiments, the signal generator 520 tailors a different amplification for signals sent to vibration devices deployed on different body areas, in order to compensate for different sensitivities at each of the body areas.

In some embodiments, the signal generator 520 produces a different signal or different amplitude of a similarly shaped signal to each of the body areas.

Optionally, the signal generator 520 introduces a delay or a phase shift between signals sent to different body areas, based, at least in part, on a distance between the different vibration devices on a wearer's body.

In some embodiments, the delay is based on a speed of sound in a body, in bones, as opposed to flesh.

In some embodiments, the delay is based on a difference between a speed of sound in air and the speed of sound in a solid medium, such as a wood floor or a concrete floor.

In some embodiments, the signal generator 520 tailors a different signal, for each of the body areas, based, at least in part, on which body area the signal is destined for.

In some embodiments, for a whole body sound sensation, it may be enough to produce body area specific amplitudes for different signals of a similar waveform. The different amplitudes may balance between the body areas, such that no body part produces sensations overpowering sensations produced by another body part.

Consequently, the sensations produced by the body parts may be well balanced.

The signal generator 520 may also tailor each of the signals with a frequency range optimal for the specific body area that the signal is destined for.

By way of a non-limiting example, the sternum reacts better to 40 Hz vibrations than the feet, when receiving the same power. In order for the sound experience to be balanced, the sternum may receive a less amplified 40 Hz signal than the feet.

In some embodiments, the signal generator 520 or the signal receiver 510, filters out or substantially attenuates brown noise frequencies and sub-harmonics thereof from the signals.

In some embodiments, the signal generator 520 or the signal receiver 510, filters out or substantially attenuates brown noise frequencies and sub-harmonics thereof from the signals.

In some embodiments, the signal generator 520 or the signal receiver 510, filters out or substantially attenuates yellow noise frequencies and sub-harmonics thereof from the signals.

In some embodiments, the signal generator 520 or the signal receiver 510, filters out or substantially attenuates green noise frequencies and sub-harmonics thereof from the signals.

By way of another non-limiting example, when the sound experience is a music experience, vibration devices are optionally placed along body acoustic meridians, at body areas such as the chest, back, waist, and feet.

Figure 6:
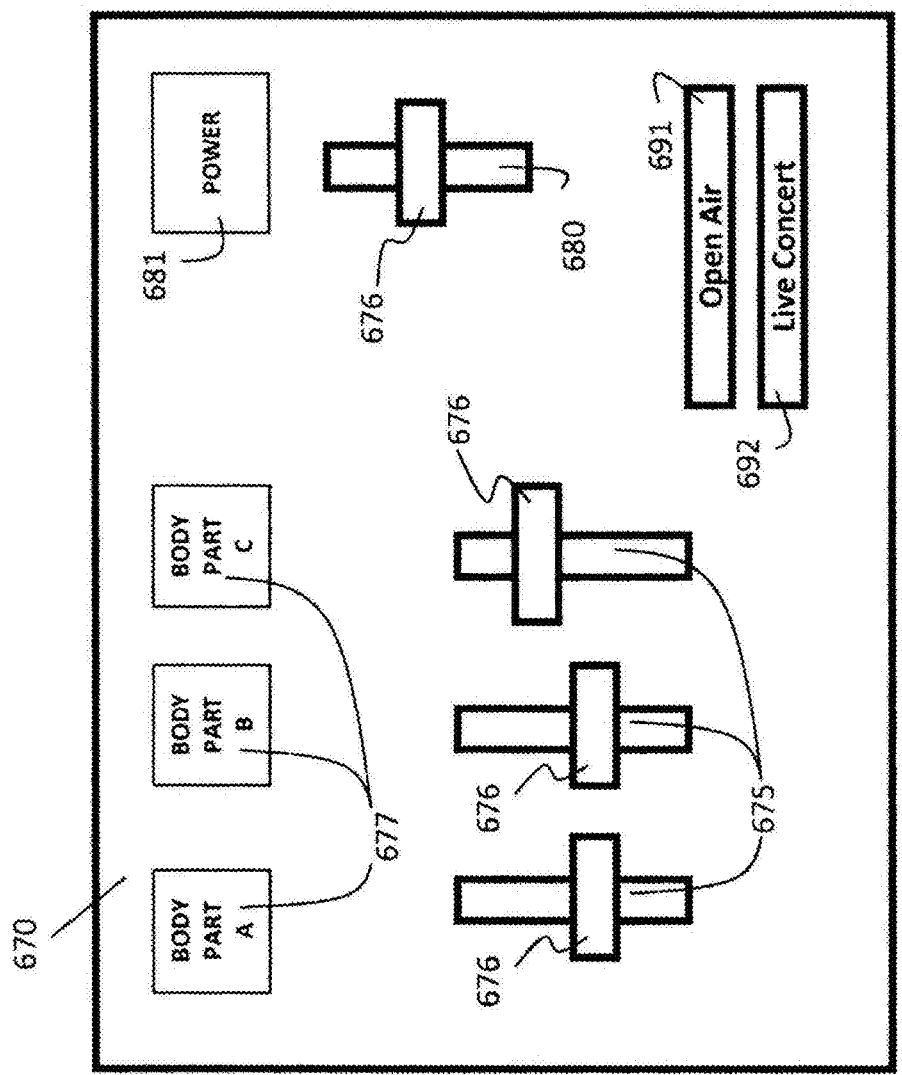
FIG. 6 is a simplified block diagram schematically illustrating a control panel, according to an exemplary embodiment of the present invention.

Reference is now made to FIG. 6, which is a simplified block diagram schematically illustrating a control panel, according to an exemplary embodiment of the present invention.

An exemplary control panel 670 may serve to illustrate one way in which a user may be allowed to control the signal generator 120 or 220, for adjusting specific amplification of a signal derived or tailored by the signal generator 120 or 220, thereby moderating vibrations felt on a specific body area, as described in further detail hereinabove.

The exemplary control panel 670 includes one or more amplification controls 675, 680.

In some embodiments, the amplification controls 675, 680 include sliders 676 to set the amplification. In some example embodiments (not shown), the amplification controls include rotation buttons, to set the amplification.

In some embodiments (not shown), the amplification controls include a touch screen with virtual controls, say sliders, radio buttons, etc., as known in the art.

In some embodiments, the control panel 670 includes an amplification control 680, for general amplification.

In some embodiments, the control panel 670 includes two or more amplification control 675, for setting amplification at different body areas.

The control panel 670 may include labels 677 for indicating to a user which amplification control 675 sets amplification for which body area and a label 681, for the general amplification control 680.

In some embodiments, the control panel 670 further provides a control (not shown) for switching between frequencies used for wirelessly communication between the signal generator 120 or 220, and the vibration devices 150 or 250, respectively.

Optionally, the control panel 670 further includes a user interface, such as one or more buttons 691 692, knobs, or a touch interface, with which the user can select among several environments.

For example, the user may be allowed to select among environments such as "live concert" 692, "open air" 691, etc. Consequently, the signal generator 120 tailors the signals, according to the user selected environment, as described in further detail hereinabove.

Figure 7:
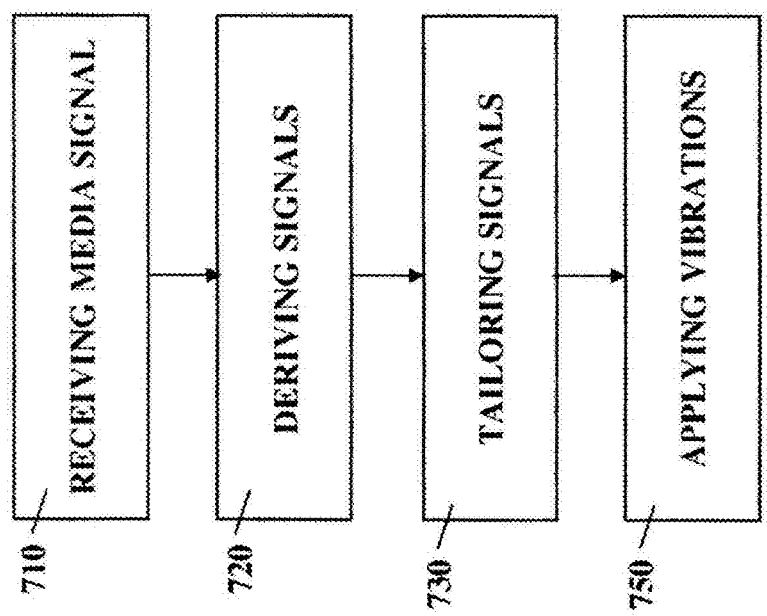
FIG. 7 is a simplified flowchart illustrating a first method for personal media playing, according to an exemplary embodiment of the present invention.

Reference is now made to FIG. 7, which is a flowchart schematically illustrating a first method for personal media playing, according to an exemplary embodiment of the present invention.

In a first exemplary method, there is received 710 a media signal, say a soundtrack of a movie or a music clip, a video clip, or a video stream, say by the signal receiver 110 of apparatus 1000, as described in further detail hereinabove.

The media signal may be received 710 from an audio source, such as an MP3 Player (say through the player's headphone socket), a computer, a game console, a media reader such as CD-ROM or a DVD (Digital Video Disc) drive, a smart phone (say Apple™ i-Phone), etc., as known in the art.

The media signal may be received 710 through a wireless connection to the audio source, through a wired connection to the audio source, through a socket such as a USB Socket of the audio source, or through any combination thereof, as described in further detail hereinabove.

Next, there are derived 720 two or more signals from the received 710 media signal, say by the signal generator 120 of apparatus 1000. The derived 720 signals may be similar, or different 5 from each other.

Optionally, the derived 720 signals are low frequency signals. The low frequency signals are signals with frequencies that the human ear is much less sensitive to, whereas other parts of the human body are much more sensitive to (say through touch).

Optionally, the signals are derived 720 for a preset number of body areas, say a number preset by a user or a manufacturer of apparatus 1000, whereas the media signal's recording may be based on a different number of channels.

In one example, the media signal originates from a hand held stereo media player with two channels, and eight low frequency signals are derived 720 from the media signal, one signal for each one of eight body areas of a user.

In another example, the media signal originates from a DVD player with seven channels, and five low frequency signals are derived 720 from the media signal, one signal for each one of five body areas of a user.

Each of the derived 720 signals is further tailored 730 for a respective one of two or more body areas of a user of the apparatus 1000, as described in further detail hereinbelow.

For example, the signal generator 120 may tailor 730 one of the derived 720 signals for a specific body area in which bone is close to skin (say one of the legs), say with a frequency (or a frequency range) optimal for a boney area.

Similarly, the signal generator 120 may tailor 730 another one of the derived 720 signals with a frequency (or a frequency range) optimal for a more fleshy area, such as the waist.

Finally, the tailored 730 signal is used to apply 750 vibrations on the specific body area, say using one or more vibration devices 150 deployed on the specific body area. The vibration device 150 vibrates on the body area, according to the signal tailored 730 for the specific body area.

The tailoring 730 of the derived 720 signals may include one or more of a variety of signal manipulations.

The signal manipulations may include, but are not limited to: insertion of a certain signal sequence into the derived 720 signal, changing the derived 720 signal's waveform, compressing certain parts of the derived 720 signal, filtering and equalization, introduction of delays between signals derived 720 for different body areas of the user, etc., as described in further detail hereinbelow.

That is to say that each of the tailored 730 signals may be optimized for a specific body area, as described in further detail hereinbelow Optionally, the derived 720 signals are tailored 730 with a waveform (say saw tooth like) optimal for the specific body area.

For example, a derived 720 signal destined for one of the user's hands, may be tailored 730 with an asymmetric waveform characterized by a relatively rapid elevation (also referred to as an attack) of amplitude, and a relatively slow decay of amplitude, or vise versa.

Consequently, upon application 750 of vibrations based on the signal tailored 730 with the asymmetric waveform, on the user's hand, there is generated a movement-like sensation on the user's hand. Further, the movement-like sensation may cause the hand to respond with a real feed-back movement, in a direction opposite the movement-like sensation (for a pushing sensation) or in the sensation's direction (for a pulling sensation).

Optionally, the derived 720 signals are tailored 730 with a frequency, or a frequency range, optimal for the body area, as described in further detail hereinabove.

Optionally, the derived 720 signals are tailored 730, by inserting a predefined sequence to the low frequency signal.

In one example, there may be inserted a specific signal sequence selected among a variety of signal sequences stored in a dedicated database of vibration effects (say a sequence typical of a boom effect), whenever there is identified a predefined signal sequence (say a sound typical of an explosion) in the media signal, as described in further detail hereinabove.

Optionally, the signals are tailored 730, so as to simulate a specific environment, such as an open air environment, a closed hall environment, a car with powerful low frequency speakers, an environment with wood floors, an environment with concrete floors, etc.

For example, a signal tailored 730 for a wood floor environment, may be inserted a sequence of wood floor vibrations, whereas a signal tailored 730 for a concrete floor, may be inserted a sequence of concrete floor vibrations.

Optionally, the signal generator 120 is preconfigured with specific amplifications, delays or phase differences, based on measurement on a user's body locations during a live sound experience in a specific environment.

The signal generator 120 may tailor 730 the derived 720 signals for the specific environment, using the specific amplifications, delays or phase differences, as measured in the specific environment.

Optionally, the user is allowed to select one the environments, say using a control panel, for selecting among the environments, as described in further detail hereinabove.

The media signal may be a signal produced upon playing of a standard, one of millions of currently available media items, such as video clips or movie soundtracks No need for a producer of the media item, to re-mix the media with special vibration channels or a modified distribution of signals among channels, or to provide a complement mix of vibration channels, in order for the present exemplary method to work.

Optionally, the vibrations are applied 750 on the specific the body area, in a manner optimal for the specific body area, say by a vibration device 750, as described in further detail hereinabove.

For example, the vibration device 150 may vibrate 750 in a direction optimal for the body area, as described in further detail hereinabove.

In the example, the vibration device 150 vibrates in a direction which best suits the specific body area that the vibration device 150 is deployed on, say in a direction perpendicular to a fleshy body area of a wearer the apparatus 1000, or transversely to a boney body area, as describe in further detail hereinabove.

Optionally, the vibration device 150 itself further includes a signal tailoring capacity (say a dedicated electric circuit for signal processing, or a frequency selective amplifier), as described in further detail hereinbelow.

Using the signal tailoring capacity, the vibration device 150 may further tailor the signal as received by the vibration device 150, say by further changing the received signal's waveform or by amplifying only parts of the received signal that are in a low frequency range, as described in further detail hereinabove.

Optionally, there is further introduced a phase difference between at least two signals tailored 730 for different body areas of the user, say for generating a sensation which moves up from a lower body area to a higher body area, or vise versa.

Optionally, there is further used control data embedded in the received 710 media signal in accordance with a predefined protocol, for tailoring 730 the low frequency signals. For example, the signal generator 120 may introduce a certain signal sequence to the signal derived 720 from the media signal, upon identifying a certain tone in the media signal received 710 by the signal receiver, as described in further detail hereinabove.

Optionally, the method further includes allowing a user to control the tailoring 720 of the signals, say using a control panel, as described in further detail hereinabove.

For example, the user may use the control panel, for adjusting the amplitude of a derived 720 signal as tailored 730 for a specific body area (say the waist). Consequently, the vibrations felt on the specific body area may be moderated, as described in further detail hereinabove. Similarly, the user may be allowed to adjust the derived 720 signals amplitude in general, or select a specific environment, as described in further detail hereinabove.

Optionally, the method further includes deriving an audio signal from the received media signal, thus reproducing at least a part of the received 710 media signal, for the user to hear.

For example, the audio signal generator of apparatus 1000 may identify audio signals at frequencies that the human ear is sensitive to, in an MP4 media signal, and forward the identified audio signals to a loudspeaker or to headphones wear by the user, as described in further detail hereinabove.

Figure 8:
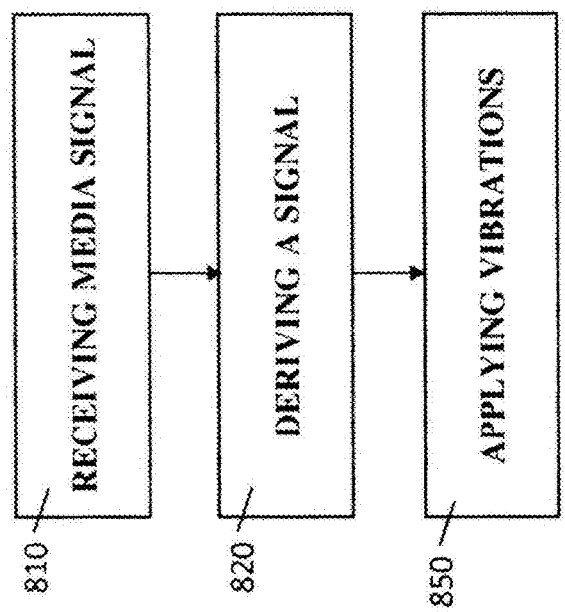
FIG. 8 is a simplified flowchart illustrating a second method for personal media playing, according to an exemplary embodiment of the present invention.

Reference is now made to FIG. 8, which is a flowchart schematically illustrating a second method for personal media playing, according to an exemplary embodiment of the present invention.

In a second exemplary method, there is received 810 a media signal, say a soundtrack of a movie, a music clip, a video clip, or a video stream, say by the signal receiver 210 of apparatus 2000, as described in further detail hereinabove.

The media signal may be received 810 from an audio source, such as an MP3 Player (say through the player's headphone socket), a computer, a game console, a media reader such as CD-ROM or a DVD (Digital Video Disc) drive, a smart phone (say Apple™ i-Phone), etc., as known in the art.

The media signal may be received 810 through a wireless connection to the audio source, through a wired connection to the audio source, through a socket such as a USB Socket of the audio source, or through any combination thereof, as described in further detail hereinabove.

Next, there is derived 820 a signal, from the received 810 media signal, say by the signal generator 220 of apparatus 2000.

Optionally, the derived 820 signals are low frequency signals. The low frequency signals are signals with frequencies that the human ear is much less sensitive to, whereas other parts of the human body are much more sensitive to (say through touch).

Finally, there are applied 850 vibrations on each specific one of two or more body areas, according to the derived 820 signal, in a manner optimal for the specific body area, say by a vibration device 250 deployed on the specific body area of the user, as describe in further detail hereinabove.

Optionally, the vibrations are applied 850 on the specific body area, in a direction optimal for the specific body area.

For example, the vibration device 250 may vibrate in a direction which best suits the specific body area that the vibration device 250 is deployed on, say in a direction perpendicular to a fleshy body area of a wearer the apparatus 2000, or transversely to a boney body area of the wearer, as describe in further detail hereinabove.

Optionally, the derived signals 820 are tailored, say using a dedicated electric circuit for signal processing or a frequency selective amplifier, included in the vibration device 250, as described in further detail hereinabove.

Optionally, the method further comprises deriving an audio signal from the received media signal, thus reproducing at least a part of the media signal, for the user to hear.

Optionally, the method further includes forwarding the audio signal derived from the media signal to a loudspeaker, or to headphones, as described in further detail hereinabove.

For example, the audio signal generator 220 of apparatus 2000 may identify audio signals at frequencies that the human ear is sensitive to, in an MP4 media signal, and forward the identified audio signals to a loudspeaker or to headphones wear by the user, as described in further detail hereinabove.

Optionally, the method further includes allowing a user to control the derivation 820 of the signal, or adjust the derived 820 signal's amplitude, before sending the signal to a vibrating device positioned on the user's chest, or another specific body area, as described in further detail hereinabove. Consequently, the vibrations felt on the user's specific body area, may be moderated, as described in further detail hereinabove.

Figure 9:
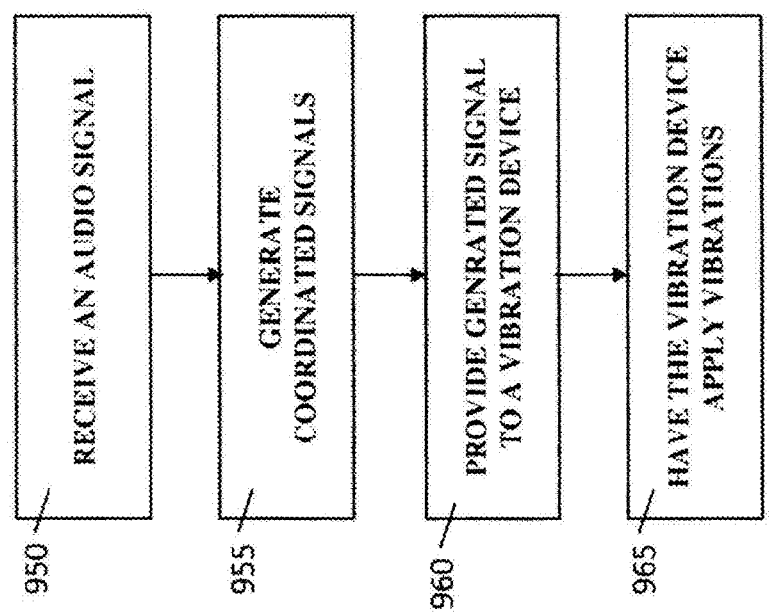
FIG. 9 is a flowchart schematically illustrating a third method for personal media playing, according to an exemplary embodiment of the present invention.

Reference is now made to FIG. 9, which is a flowchart schematically illustrating a third method for personal media playing, according to an exemplary embodiment of the present invention.

In a third exemplary method, there is received 950 an audio signal.

Based, at least in part, on the received 950 audio signal, there are generated 955 coordinated signals, tailored for inducing location-specific vibrations at different areas of a person's body.

Next, each of the generated 955 coordinated signals is provided 960 to a respective vibration device located at a respective one of the body areas. Finally, the vibration device is used to impart 965 low frequency vibrations on the body area, based, at least in part, on the coordinated signal provided 960 to the vibration device.

Optionally, the imparted 965 vibrations have a characteristic optimized for the respective area on the person's body, as described in further detail hereinabove.

It is noted that coordinating the signals for inducing vibration is optionally done based on one or more of the following criteria:
a different amplitude for each of the signals based on which body area the signal is destined for, by way of a non-limiting example based on a sensitivity of the body area, based on whether the vibration device is attached to a bony body area or rather to a fleshy body area, etc.;
a different amplitude for at least one of the signals based on an amplitude set by the person, using a control panel, as described in further detail hereinabove; and
a different delay (and thus a change in phase) to each of the signals based on a distance from a source of the sound, on a distance from the person's head, on a distance from a foot of the person, on a distance between the vibration devices, etc. The delay may optionally be set according to a difference between a speed of sound in air, and a speed of sound in bone, or other parts of a human body, etc.

Figure 10:
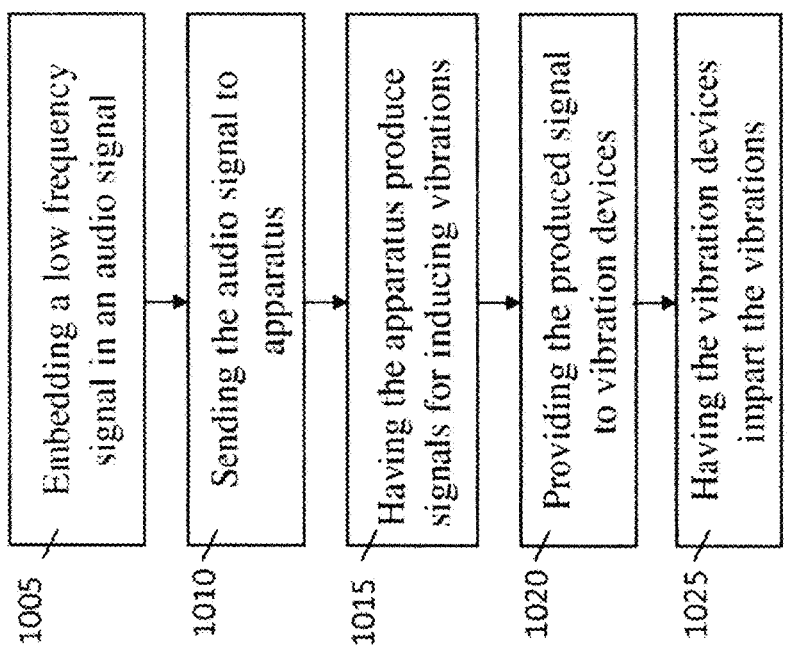
FIG. 10 is a flowchart schematically illustrating a fourth method for personal media playing, according to an exemplary embodiment of the present invention.

Reference is now made to FIG. 10, which is a flowchart schematically illustrating a fourth method for personal media playing, according to an exemplary embodiment of the present invention.

A fourth example method includes the steps of:
Generating an enhanced media signal, say an enhanced audio signal, by embedding 1005 one or more low frequency signals in the audio signal;
Sending 1010 the enhanced audio signal to an apparatus which accepts the enhanced audio signal;
Having 1015 the apparatus produce a signal tailored for inducing location-specific vibrations at one or more user's body area, based, at least in part, on one of the embedded 1005 low frequency signals;
Providing 1020 each of the produced signals to a respective one (or more) vibration devices, deployed on a specific body area; and
Having 1025 the vibration devices impart low frequency vibrations based, at least in part, on the provided 1020 low frequency signal, to the specific body area.

Optionally, the low frequency signals are embedded in a dedicated channel. Optionally, the low frequency signals are embedded in several dedicated channels. In such a case, the channels may optionally be tailored to their intended body areas. By way of an example, inducing vibrations for the feet may be encoded at a specific frequency or frequency range, and inducing vibrations for a different body part, such as the waist or chest, may be encoded at a different specific frequency or frequency range.

Optionally, the embedded signals contain control data which complies with a protocol which may be adapted by the music industry. In some embodiments, there are different dedicated channels, each one encoding control data for a different body area.

In some embodiments, the encoding for at least one of the body areas includes encoding for when vibration is to be imparted, and at what amplitude the vibration is to be imparted.

In some embodiments, the dedicated channels may be packaged within a video stream, say during a vertical blanking interval, within an encoded video image, etc.

An apparatus according to an exemplary embodiment of the present invention may include vibration devices, each of which is designed, so as to apply vibrations on a specific body area, in a manner optimal for the specific body area.

The following figures are used to illustrate some novel and inventive designs for a vibration device (also referred to hereinbelow as a 'vibration transducer'), according to exemplary embodiments of the present invention.

Figure 11A:
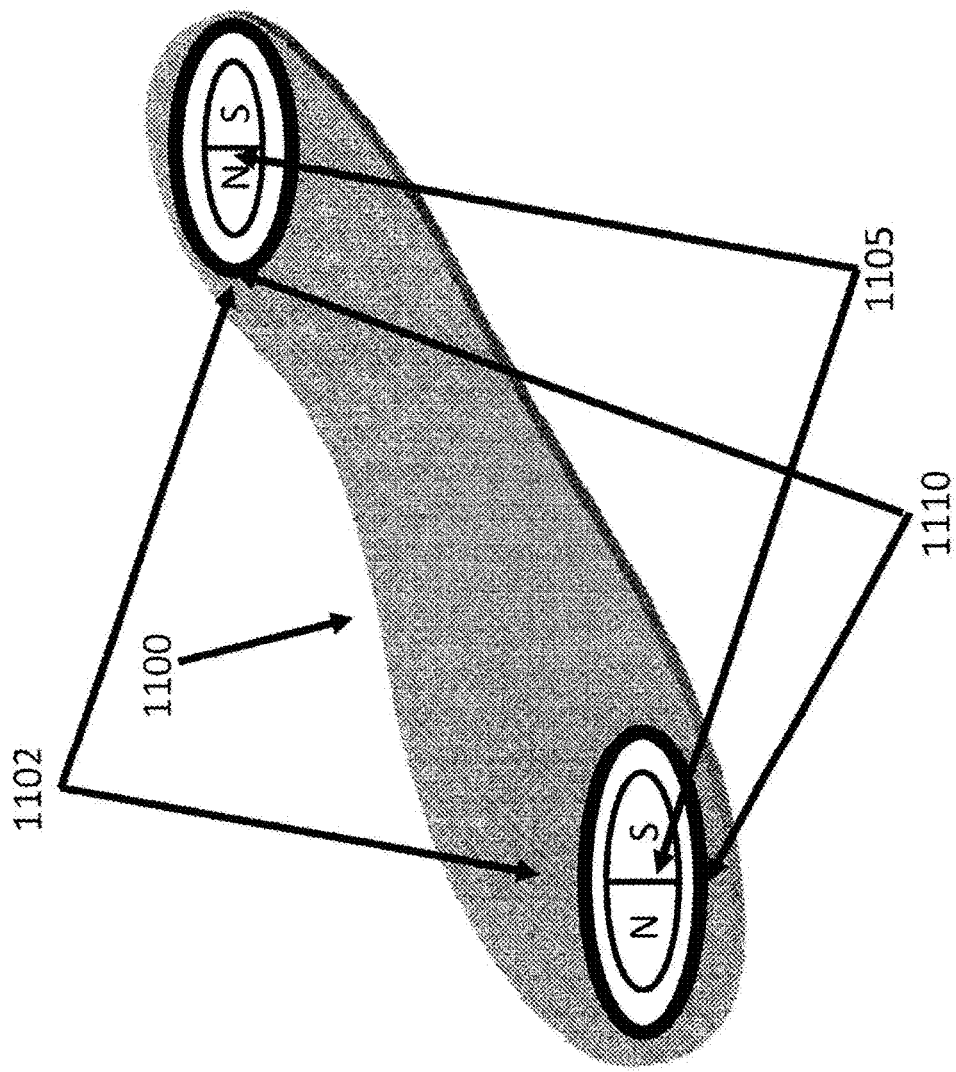
FIG. 11A is a simplified block diagram schematically illustrating a shoe sole with vibration transducers, according to an exemplary embodiment of the present invention.

Reference is now made to FIG. 11A, which is a simplified block diagram schematically illustrating a shoe sole with vibration transducers, according to an example embodiment of the present invention.

FIG. 11A depicts a sole 1100 of a shoe which includes, built in or retro-fitted, a pair of vibration transducers 1102.

In the example of FIG. 11 A, the vibration transducers 1102 include magnets 1105 and coils 1110. The coils 1110 accept an alternating electric current which causes the magnets 1105 to vibrate at low frequency, and impart the vibrations to a foot of a wearer of the shoe.

The magnets 1105 may be permanent magnets, electromagnets, etc., as known in the art.

In some embodiments, the vibrations are imparted to the sole of the foot in a direction transverse to the sole of the foot, whether sideways, front and back, or both.

Imparting vibrations to the sole of the foot in a direction transverse to the sole of the foot may produce a vibration sensation which is less dependent on a person's pressure on the sole of the foot. A foot unit may be less dependent on a person's weight, on how much weight is placed on each foot, on a person walking about while sensing the vibrations, and so on.

In some embodiments, the foot vibration transducers 1102 impart vibrations to the sole of the foot in a direction perpendicular to the sole of the foot.

With vibrations imparted to the sole of the foot in a direction perpendicular to the sole of the foot, there may be energy loss to a floor, and the vibration sensation may be uneven during walking.

In some embodiments, the vibration transducers 1102 include one or more pressure sensing units, for measuring pressure at the sole of the shoe. The pressure sensed may enable modifying amplitude of the low frequency vibrations based, at least in part, on the sensed pressure. The optional modifying is performed so as to produce a substantially equal vibration sensation regardless of pressure on the foot sole.

In some embodiments, the sole 1100 is modified so as to lower its contact area against a floor, for example to specific strips or spots. The contact areas of the sole with the floor also press against a user's foot. The vibration transducers 1102 are optionally located, so as to produce vibration in the minimal contact areas, which press less significantly against the sole.

In some embodiments, the sole 1100 has shock absorbers or other pressure manipulation devices or components, built to lessen changes in pressure against the foot sole during stepping, thereby allowing the vibrations imparted by the vibration transducers 1102 to be felt in a better and more balanced manner.

Figure 11C:
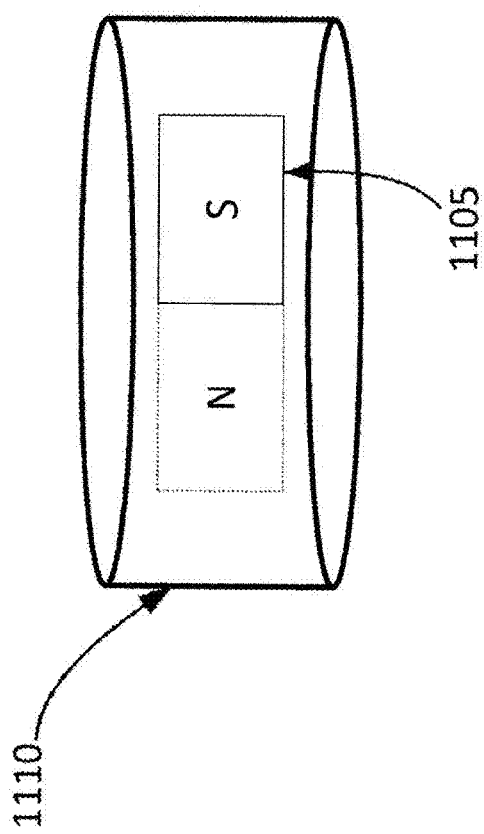

Reference is now made to FIGS. 11B and 11C, which are simplified block diagrams schematically and respectively illustrating a top view and a side view of a first vibration transducer, according to exemplary embodiments of the present invention.

FIGS. 11B and 11C depict the magnets 1105 and the coils 1110 of the vibration transducers 1102 built into the shoe sole of FIG. 11A, and their relative positions.

It is noted that the novel vibration transducer 1102 of FIG. 11A-C acts differently than conventional speakers, voice coils, and solenoids. While the speakers, voice coils, and solenoids use a coil to move a mass linearly along an axis defined by a center of their electric coils, the vibration transducer 1102 "wiggles" the magnet 1105 about the axis. Optionally, the vibration transducer 1102 is a compact design, with a moving part (say the magnets 1105) which does not extend substantially beyond the coil 1110, as described in further detail hereinbelow.

In some embodiments, the magnet 1105 and the coil 1110 are connected to each other by an elastic member. Some non-limiting examples of the elastic member include an elastic membrane, optionally a non-conducting membrane, several elastic arms, etc., as described in further detail hereinbelow.

In some embodiments of, the magnet 1105 and the coil 1110 are connect to a supporting frame (not shown). Optionally, the magnet 1105, the coil 1110 or both, are connected to the supporting frame by an elastic member (not shown).

Reference is now made to FIGS. 12A, 12B, and 12C, which are simplified block diagrams schematically and respectively illustrating, a second, a third, and a fourth vibration transducer, according to exemplary embodiments of the present invention.

FIG. 12A depicts an example of a flat design for a vibration transducer.

The example vibration transducer of FIG. 12A includes a magnet 1220 within a coil 1215. Optionally, both the magnet 1220 and the coil 1215 have a flat design, by way of a none-limiting example, being not more than 1 cm high, 5 mm high, or even not more than 3 mm high.

FIG. 12B depicts an example of a vibration transducer which uses two magnets 1220, and one coil 1215.

FIG. 12C depicts a yet another example of a vibration transducer, which uses two coils 1215 and a single magnet 1220.

The vibration transducers of FIGS. 12B and 12C are optionally used where more height is available, especially when more power is needed.

Figure 13:
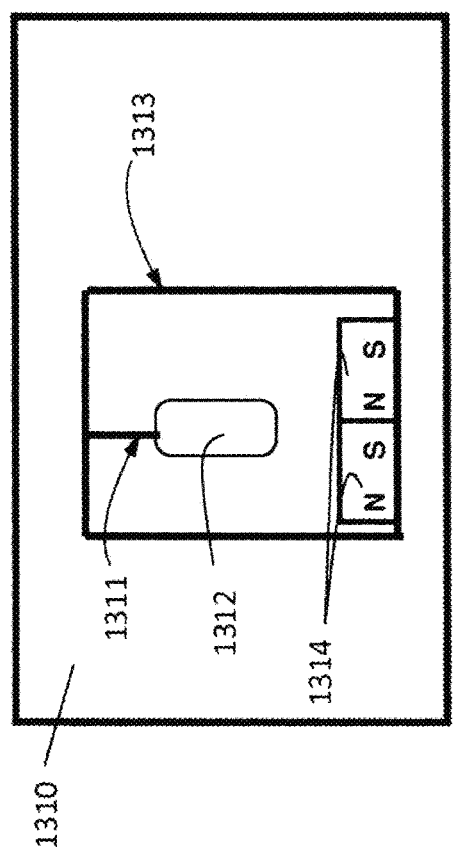
FIG. 13 is a simplified block diagram schematically illustrating a fifth vibration transducer, according to an exemplary embodiment of the present invention.

Reference is now made to FIG. 13, which is a simplified block diagram schematically illustrating a fifth vibration transducer, according to an exemplary embodiment of the present invention.

The example vibration transducer 1310 of FIG. 13 includes an elastic element, say a spring 1311, connected on one end to a supporting frame 1313 and on the other end to a coil 1312, one or more magnets 1314 optionally connected to the same supporting frame 1313. The spring 1311 is optionally a substantially stiff wire, a flat spring, or structures which are similarly elastic and somewhat resistant to flexing. Optionally, the spring 1311 forms a part of the frame 1313 itself, or the whole frame 1313.

In some embodiments, the coil 1312 and the magnets 1314 are embedded in a flexible substrate (not shown) such as in rubber, in a flexible silicone pad, in a gel, or in similar substrates, with or without the above-mentioned spring 1311.

Optionally, the spring 1311, the magnets 1314 and the coil 1312 together, act as a "sprung mass", which has a characteristic resonance frequency.

In some embodiments, the spring 1311 is designed with a mechanical resonant frequency in the range of vibration frequencies induced by a signal received by the vibration transducer 1310, in order to enable a strengthened and efficient response to the signals exciting the vibrations, as described in further detail hereinabove.

Consequently, sensations experienced by a user who wears the transducer 1310, may be enhanced, and the transducer 1310 may operate in a manner which is more energy efficient.

That is to say that the transducer 1310 is designed with a mechanical resonant frequency which is set to be within the range of the induced vibration frequencies, in order to enable an efficient mechanical coupling to the signals exciting the vibrations. Consequently, there are produced stronger vibrations with less exciting energy, as described in further detail hereinbelow.

With such embodiments, the input sound signal does not require complicated manipulation in order to drive the vibration transducer 1310, only optionally some amplification, as the vibration is further amplified by the mechanical resonance of the transducer's spring 1311. Vibrations produced in such a transducer 1310, may also provide good fidelity to the original sound.

Further, with such embodiments, the frequency response of the vibration transducers, may also allow vibrations induced by a regular sound signal, optionally but not necessarily amplified. Due to harmonization of the signal exciting the vibration (i.e. the regular sound signal) and the spring's 1311 mechanical resonant frequency, there may be produced a sufficient and effective vibratory response.

In operation, the coil 1312 optionally receives an optionally amplified changing electric current, and moves relative to a magnetic field produced by the magnet(s) 1314.

The magnets 1314 may be regular permanent magnets, neodymium magnets, electromagnets, etc., as known in the art.

Figure 14:
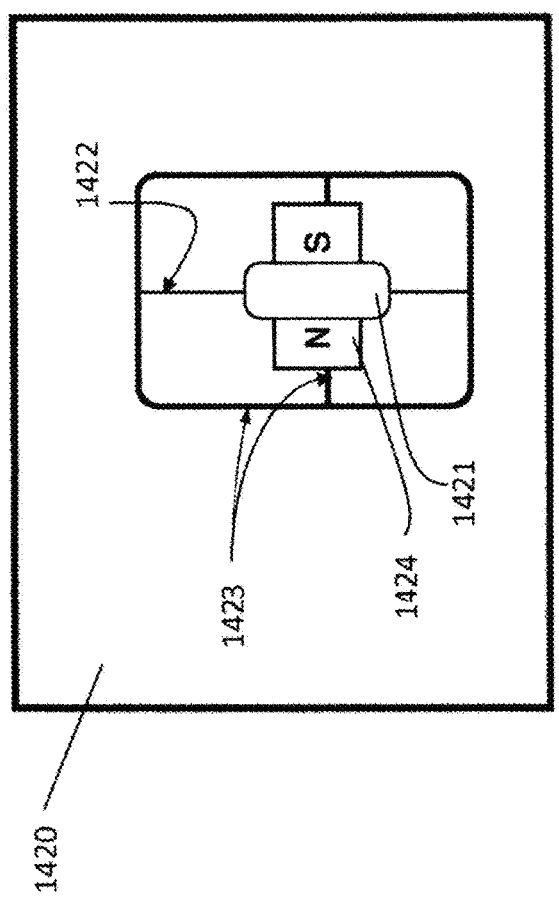
FIG. 14 is a simplified block diagram schematically illustrating a sixth vibration transducer, according to an exemplary embodiment of the present invention.

Reference is now made to FIG. 14 which is a simplified block diagram schematically illustrating a sixth vibration transducer, according to an example embodiment of the present invention.

The vibration transducer 1420 of FIG. 14 includes a coil 1421 connected by an elastic element such as a spring 1422 to a supporting frame 1423, above a magnet 1424 also connected to the supporting frame 1423.

Upon supply of an alternating electric current to the coil 1421 of the present example, the coil 1421 of the present example moves in a manner similar to the movement of the coil 1312 of the vibration transducer 1310 of FIG. 13 with a little less headroom, making the present transducer 1420 better suited for in-shoe and/or under-shoe use.

Figure 15:
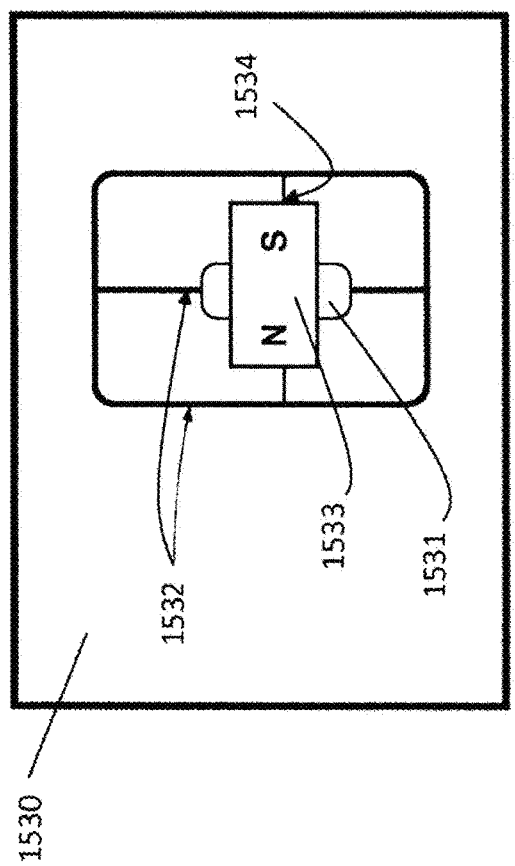
FIG. 15 is a simplified block diagram schematically illustrating a seventh vibration transducer, according to an example embodiment of the present invention.

Reference is now made to FIG. 15 which is a simplified block diagram schematically illustrating a seventh vibration transducer, according to an example embodiment of the present invention.

The vibration transducer 1530 of FIG. 15 includes a coil 1531 connected to a supporting frame 1532.

The exemplary transducer 1530 also includes a magnet 1533 positioned above the coil 1531. The magnet 1533 is attached to an elastic element, say a spring 1534.

Upon supplying an alternating electric current to the coil 1531, a changing magnetic field is generated in the coil 1531. The changing electric field moves the magnet 1533 back and forth, over the coil 1531. Consequently, there are generated vibrations similar to the vibrations of the vibration transducer 1310 of FIG. 13, with a little less headroom, making the vibration transducer 1530 better suited for in-shoe and/or under-the-shoe use, as the mechanism and electronic components may optionally be implanted into a shoe sole.

The exemplary vibration transducers illustrated in FIGS. 13, 14 and 15, are novel transducers which act differently from conventional speakers, voice coils, and solenoids. While the speakers, voice coils, and solenoids use a coil to move a mass linearly along an axis defined by a center of their electric coils, the novel vibration transducers of FIGS. 13, 14 and 15, rather "wiggle" the magnets or the coils.

The vibration transducers 1310, 1420 and 1530 may have a flat design, in which their coils may optionally be co-planar with their magnets.

The vibration transducer 1310, 1420 and 1530 may optionally have a short design, in which their magnets and their coils are not distributed lengthwise along the frame.

Figure 16:
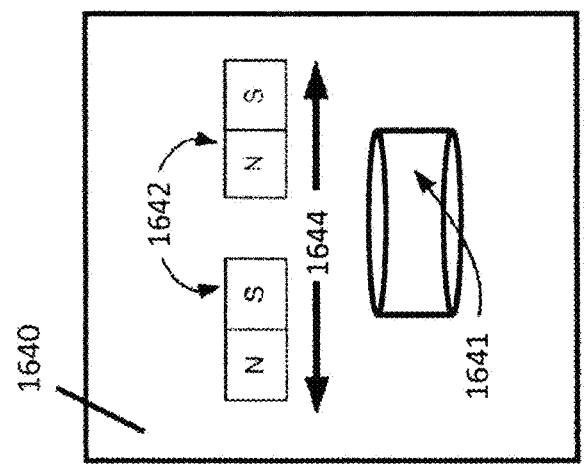
FIG. 16 is a simplified block diagram schematically illustrating an eight vibration transducer, according to an example embodiment of the present invention.

Reference is now made to FIG. 16, which is a simplified block diagram schematically illustrating an eight vibration transducer, according to an example embodiment of the present invention.

An exemplary vibration transducer 1640 includes one coil 1641, and two magnets 1642 arranged in a zero-cross configuration. In the zero-cross configuration, the two magnets 1642 are arranged in an array in which a first magnet's North pole faces a second magnet's South pole. The axis of the coil 1641 is directed substantially midway between the two magnets 1642, i.e. opposite the point in which the magnets' 1642 magnetic field intensity is maximal, as described in further detail hereinbelow. Consequently, there is maximized the magnetic force between the coil 1641 and the magnets 1642, and the vibration transducer 1640 efficiency may increase.

In an alternative zero-cross configuration, according to an exemplary embodiment of the present invention, a single magnet is used together with one or more coils. In the alternative zero-cross configuration, the axis of the coil(s) is/are directed substantially midway between the magnets poles, i.e. opposite the middle point in which the intensity of the magnet's field is maximal. Consequently, there is optimized the magnetic induction between the coil(s) and the magnet, and the vibration transducer efficiency may increase.

As described hereinabove, the coil 1641, the magnets 1642, or both, may be connected to a support frame (not shown), to each other (or both), by an elastic member (not shown).

Movement induced by signals applied to the coil 1641 may accelerate the coil 1641, or the magnets 1642.

The acceleration causes movement which may optionally be constrained to be in one direction or another, say for imparting the vibration in a direction which is optimal for the body area on which the vibration transducer 1640 is deployed, as described in further detail herein above.

For example, the magnets 1642 may optionally be constrained, optionally by the frame or by a connection between the coil 1641 and the magnets 1642, to move only in a horizontal direction or in a specific tangential movement, over the coil 1641, as indicated by the arrow 1644 of FIG. 16.

Figure 17:
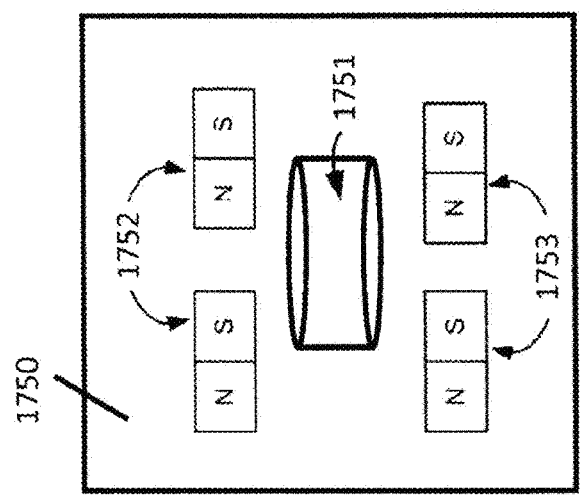
FIG. 17 is a simplified block diagram schematically illustrating a ninth vibration transducer, according to an example embodiment of the present invention.

Reference is now made to FIG. 17, which is a simplified block diagram schematically illustrating a ninth vibration transducer, according to an example embodiment of the present invention.

An exemplary vibration transducer 1750 includes one coil 1751 and two pairs of magnets 1752, 1753, arranged in a zero-cross configuration. In the zero-cross configuration, each pair of magnets 1752 1753 is arranged so that a first magnet's
  North pole faces a second magnet's South pole. Further, the two pairs of magnets 1752 1753 are arranged so as to have their North and South poles face in the same direction.

Similarly to FIG. 16, both pairs 1752 1753 of magnets, are constrained (say using a frame), and move in a horizontal direction or in a specific tangential movement. However, when one pair 1742 moves in one direction (say from left to right), the second pair 1753 moves in an opposite direction (say from right to left).

Figure 18:
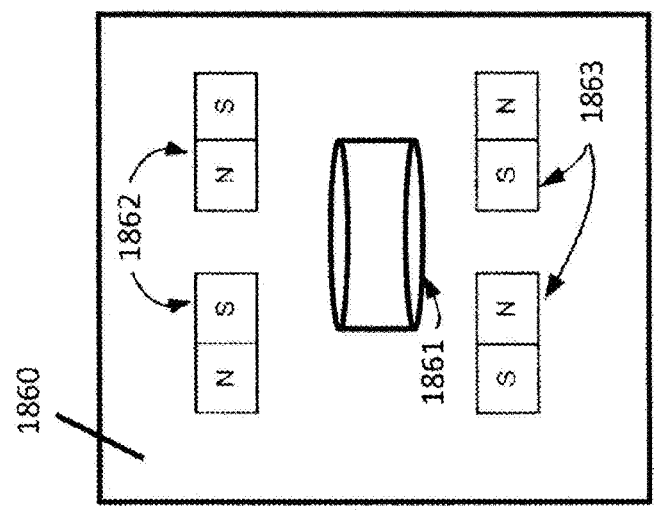
FIG. 18 is a simplified block diagram schematically illustrating a tenth vibration transducer, according to an example embodiment of the present invention.

Reference is now made to FIG. 18, which is a simplified block diagram schematically illustrating a tenth vibration transducer, according to an example embodiment of the present invention.

An exemplary vibration transducer 1860 including one coil 1861 and two pairs of magnets 1862 1863, arranged in a zero-cross configuration in which each pair of magnets 1862 1863 is arranged so that a first magnet's North pole faces a second magnet's South pole. The two pairs of magnets 1862 1863 are arranged so as to have their North and South poles face in opposite directions.

Similarly to FIG. 16, both pairs 1862 1863 of magnets, constrained say using a frame, move in a horizontal direction or in a specific tangential movement. However, when one pair 1862 moves in one direction (say from left to right), the second pair 1863 moves in the same direction (also from left to right).

Figure 19:
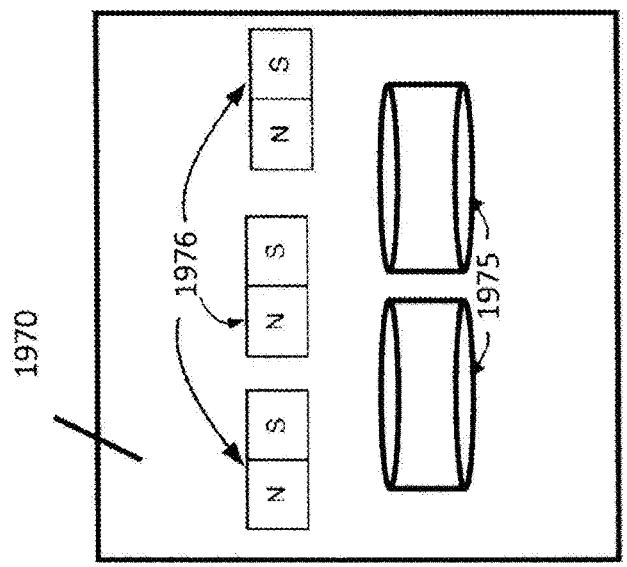
FIG. 19 is a simplified block diagram schematically illustrating an eleventh vibration transducer, according to an example embodiment of the present invention.

Reference is now made to FIG. 19, which is a simplified block diagram schematically illustrating an eleventh vibration transducer, according to an example embodiment of the present invention.

An exemplary vibration transducer 1970 includes two coils 1975 and three magnets 1976, arranged in a zero-cross configuration. FIG. 19 serves to demonstrate that the number of magnets 1976 does not have to be even. It is also noted that the number of coils 1975 also does not have to be even.

Optionally, the magnets 1976 are dispersed inside the transducer 1970, such that the direction of rotation of each magnet and coil may differ from the direction of rotation of the other magnets or coils. Consequently, the transducer 1970 may rotate in various directions, as described in further detail hereinbelow.

Figure 20:
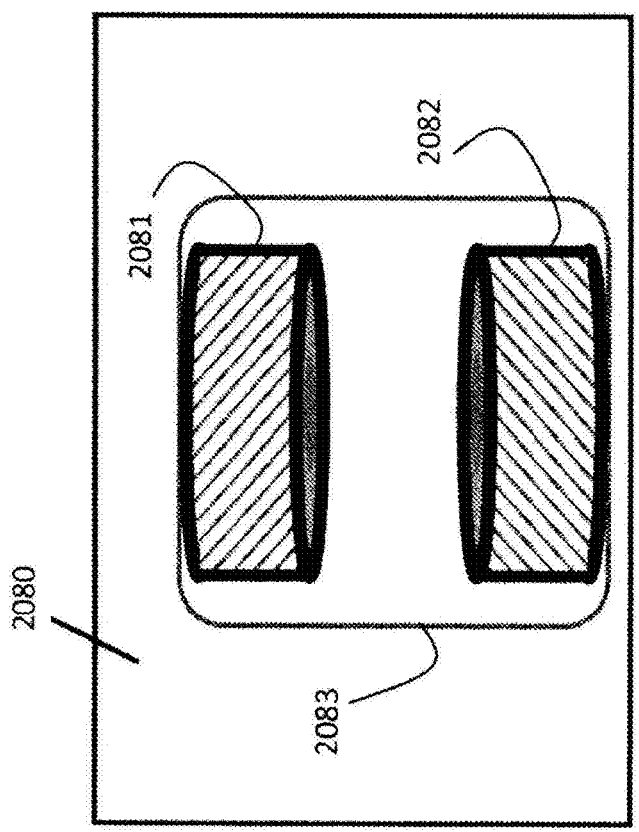
FIG. 20 is a simplified block diagram schematically illustrating a twelfth vibration transducer, according to an example embodiment of the present invention.

Reference is now made to FIG. 20, which is a simplified block diagram schematically illustrating a twelfth vibration transducer, according to an example embodiment of the present invention.

An exemplary vibration transducer 2080 includes two coils 2081, 2082, affixed to opposite sides of a partially elastic frame 2083. The frame 2083 restricts movement of the coils 2081, 2082, to horizontal movement or to a specific tangential movement.

Upon supplying of an alternating electric current to the coils 2081, 2082, the two coils move back and fourth, in opposite directions. For example, if one coil 2081 moves from left to right, the second coil 1282 moves from right to left.

Figure 21:
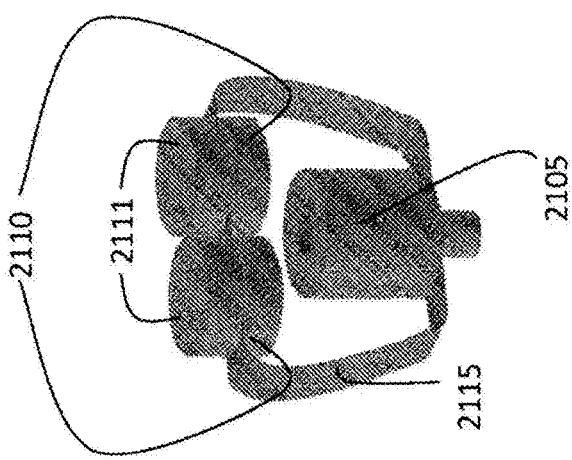
FIG. 21 is a simplified block diagram schematically illustrating a thirteenth vibration transducer, according to an example embodiment of the present invention.

Reference is now made to FIG. 21, which is a simplified block diagram schematically illustrating a thirteenth vibration transducer, according to an example embodiment of the present invention.

An exemplary vibration transducer illustrated in FIG. 21, includes a coil 2105 and one or more magnets 2110, attached to a frame 2115.

The frame 2115, or at least a part of the frame 2115, is elastic. That is to say that the frame 2115 itself is an elastic element.

In the exemplary transducer of FIG. 21, both the magnets 2110 and the coil 2105 are attached to the frame's 2115 (i.e. the elastic element) inner face.

The magnets 2110 are arranged in a zero-cross configuration, say in an array of two magnets 2110 in which a first magnet's North pole faces a second magnet's South pole, as described in further detail hereinabove.

Optionally, each of the magnets 2110 is further paired to an opposite magnet 2111 deployed in the frame's 2115 outer face.

Consequently, the paired magnets 2110 2111 stick to each other, and remain attached to the frame 2115 between them. Consequently, the exemplary transducer of FIG. 21 may be manufactured without gluing or fastening of the magnets 2110 to frame 2115 using a screw, thus making the transducer's manufacturing process faster and cheaper.

Upon supply of an electric current (i.e. a signal) which alternates in low frequency to the coil 2105, the coil 2105 generates a magnetic field which alternates between opposite polarization directions which are perpendicular to the core of the coil 2105 and parallel to the axis of the coil 2105. The axis of the coil 2105 is directed substantially midway between the magnets 2110.

That is to say the alternating magnetic field of the coil 2105 is oriented substantially perpendicularly to the array of the magnets 2110 and substantially opposite a midway point between the magnets 2110. The midway point is a point in which intensity of the magnetic field of the magnets 2110 is maximal, as described for the zero-cross configurations hereinabove. Consequently, the force between the coil 2105 and the magnets 2110 is optimized.

Optionally, the frame 2115 is designed so as to align the coil 2105 and magnets 2110 in a distance optimized for the specific size of the magnets 2110, the specific diameter of the coil 2105, the specific strength of the magnets' 2110 fields, the average strength of the magnetic field generated by the coil 2105, the maximal strength of the magnetic field generated by the coil 2105, etc., or any combination thereof.

For example, the coil 2105 and magnets 2110 may be aligned so as to have the alternating magnetic field of the coil 2105 maximize in a point between the midway point and the core of the coil 2105, in which the magnetic field of the magnets 2110 is maximal.

Optionally, the coil 2105 is designed with an optimal diameter, so as to have the alternating magnetic field of the coil 2105 maximize in the point between the midway point and the core of the coil 2105, in which the magnetic field of the magnets 2110 is maximal.

Optionally, the coil 2105 is designed with magnetic field induction which maximizes at an electric current of a low frequency range characteristic of the low frequency signals derived from the media signal, and received by the vibration transducer, as described in further detail hereinabove.

The frame 2115 is designed so as to restrain horizontal movement of the magnets 2110 over the coil 2115. Thus, the movement of the magnets 2110 may be constrained to specific linear or tangential movement, for applying vibrations in a direction optimal for a specific body area of a user.

Optionally, the frame 2115 is designed with a mechanical resonant frequency in the range of vibration frequencies induced by signals transmitted to the transducer 500, in order to enable a strengthened and efficient response (i.e. vibrations) to the signals transmitted to the transducer of FIG. 21, as described in further detail hereinabove.

That is to say that the frame 2115 functions as a string having a mechanical resonant frequency in the range of vibration frequencies induced by signals transmitted to the transducer of FIG. 21.

Due to harmonization of signals exciting the vibration (i.e. the simple sound signal) and the frame's 2115 own mechanical resonant frequency (through wave superposition, as known in the art), there is produced an amplified vibratory response.

Consequently, an input sound signal does not require complicated manipulation in order to drive the vibration transducer of FIG. 21, as the vibration is amplified by the mechanical resonance of the frame 2115. Further, vibrations produced by the transducer also provide good fidelity to the original sound.

That is to say that the transducer's frame 515 is designed with a mechanical resonant frequency which is set to be within the range of the induced vibrations' frequencies, in order to enable an efficient mechanical coupling to the signals exciting the vibrations. Consequently, there are produced stronger vibrations with less exciting energy.

When an alternating magnetic current is supplied to the coil 2105, the alternating current generates a magnetic field in the core of the coil 2105, which works to repel or attract the magnets 2110 to the coil 2105.

However, the frame 2115 is designed to hold the magnets 2110 in a fixed vertical distance from the coil 2105. The frame's 2115 vertical resistance coefficient is strong enough to hold the magnets in a fixed vertical distance, away from the coil 2105. That is to say that the frame 2115 may prevent any significant movement of the magnets 2110 to (or away from) the coil 2105 under the magnetic field induced in the coil 2105.

Consequently, the frame 2115 restricts the movement of the magnets 2110 to a significantly horizontal line.

The frame's 2115 design allows horizontal movement of the magnets 2110 over the coil 2105. Consequently, the magnetic field induced in the coil 2105 moves the magentas 2110 horizontally, over the coil 2105.

However, the frame 2115 is designed with elasticity which works to bring the magnets 2110 back to a central position over the coil 2105, in which the midway between the magnets 2110 is substantially opposite the core of the coil 2105.

As the magnetic field induced in the coil 2105, which moves the magnets 2110 in one horizontal direction changes, the frame 2115 generates an opposite mechanical force which tends to push the magnets 2110 back to the central position.

Based on a spring-like rate coefficient which characterizes the frame 2115, the magnets 2110 horizontal movement is limited to a certain distance away from the central position, in which the magnetic force equals the opposite mechanical force generated by the frame 2115, as prescribed by Hook's law, as known in art.

Similarly, when the coil's 2105 magnetic field polarization changes, the magnets 2110 are moved in the opposite horizontal, until the magnets 2110 reach a certain distance away from the central position, in which the magnetic force equals the opposite mechanical force generated by the frame 2115, as prescribed by Hook's law.

Consequently, the vibrations of the magnets 2110 are characterized by horizontality and well as low frequency (in spite of the transducer's relatively small size).

Figure 22:
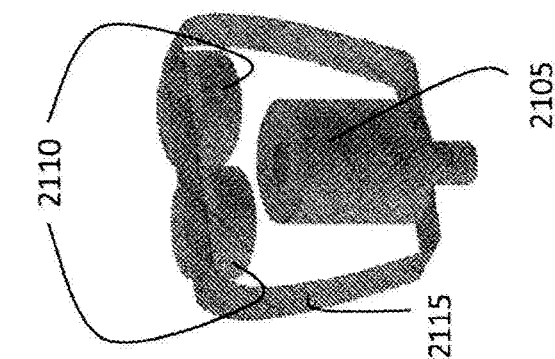
FIG. 22 is a simplified block diagram schematically illustrating a fourteenth vibration transducer, according to an example embodiment of the present invention.

Reference is now made to FIG. 22, which is a simplified block diagram schematically illustrating a fourteenth vibration transducer, according to an example embodiment of the present invention.

An exemplary transducer illustrated using FIG. 22 includes the coil 2105, magnets 2110, and frame 2115 of FIG. 21.

Similarly, to the vibration transducer of FIG. 21, in the transducer illustrated in FIG. 22, both the magnets 2110 and the coil 2105 are attached to the frame's 2105 (i.e. the elastic element) inner face.

However, in the example transducer of FIG. 22, the magnets 2110 are attached to the frame 2115 using glue or using a fastener (say a screw), rather than by the opposite magnets 2111 of FIG. 21.

Figure 23:
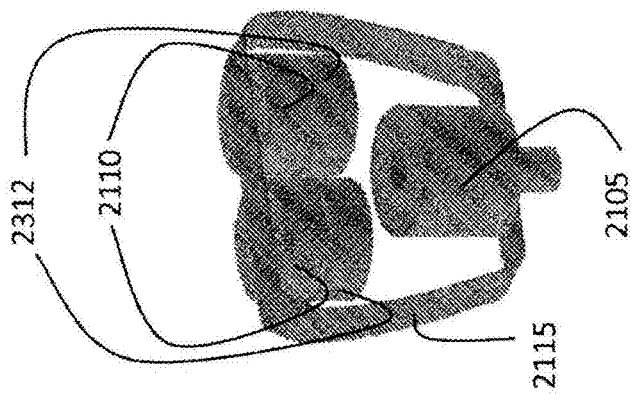
FIG. 23 is a simplified block diagram schematically illustrating a fifteenth vibration transducer, according to an example embodiment of the present invention.

Reference is now made to FIG. 23, which is a simplified block diagram schematically illustrating a fifteenth vibration transducer, according to an example embodiment of the present invention.

The exemplary transducer of FIG. 23 includes the coil 2105, magnets 2110, and frame 2115 of FIG. 21. However, in the example transducer of FIG. 23, the magnets 2110 are attached to the frame 2115 using glue or using a fastener (say a screw), rather than by the opposite magnets 2111 of FIG. 21.

The example transducer of FIG. 23 further includes a second pair of magnets 2312, magnetically attached to the magnets 2110 attached to the frame 2115.

Together, the two pairs 2110 and 2312, form a stronger magnetic array attached to the at least partially elastic frame 2115, which upon supplying an alternating electric current to the coil 2105, moves back and fourth horizontally, over the coil 2105, as described in further detail hereinabove.

According to some exemplary embodiment of the present invention, two or more magnets and/or coils are arranged inside a single vibration transducer, in an array designed so as to produce a vibration in one or more direction(s) optimal for the body location on which the vibration transducer is deployed.

In some exemplary embodiments of the present invention, two or more magnets and/or two or more coils are used together in a single vibration transducer, in a manner which may produce vibrations in two or more directions, in two or three spatial dimensions, as described in further detail and illustrated using FIGS. 24 and 25, hereinbelow.

Figure 24:
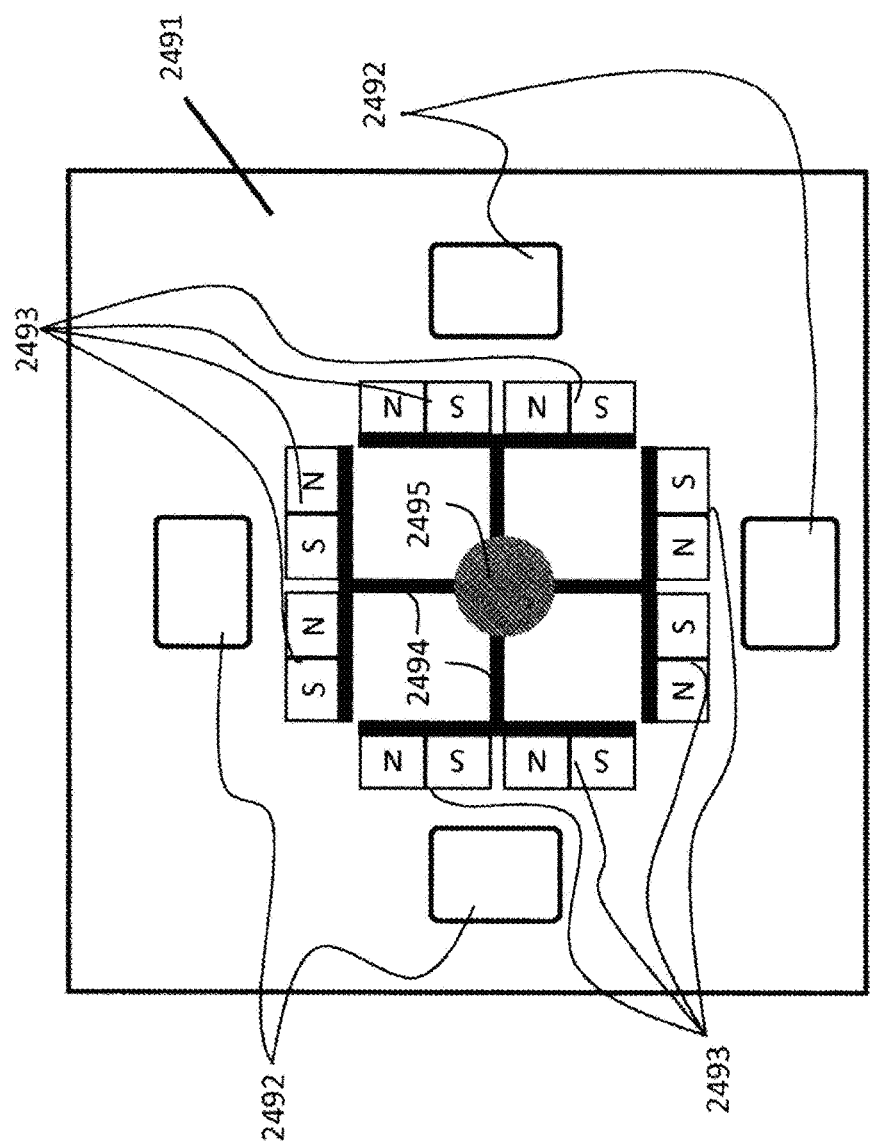
FIG. 24 is a simplified block diagram schematically illustrating a first multidirectional vibration transducer, according to an exemplary embodiment of the present invention.

Reference is now made to FIG. 24, which is a simplified block diagram schematically illustrating a first multi-directional vibration transducer, according to an exemplary embodiment of the present invention.

An exemplary multi-directional vibration transducer 2491 includes four coils 2492.

The multi-directional vibration transducer 2491 further includes four pairs of magnets 2493 affixed to a square-like frame 2494.

Each of the magnet pairs 2493 is affixed to a respective side of the frame 2494, and arranged in a zero-cross configuration, in which a first magnet's North pole faces a second magnet's South pole, as described in further detail hereinabove.

The frame 2494 is connected to an elastic element 2495 positioned in the center of the frame 2494, say to a sponge or to a set of springs.

Alternatively, the frame's 2494 corners, or the frame's 2494 sides may be connected to a set of elastic elements (not shown), say to springs arranged around the frame 2494, which allows vertical and horizontal movement of the frame 2494.

Each of the coils 2492 is deployed opposite one of the sides of the frame 2492. More specifically, the coil 2492 is deployed opposite a point substantially midway between the two magnets forming a pair 2493 affixed to the side, thus maximizing the magnetic force applied on the magnet pair 2493 when a magnetic field is formed in the coil 2492, as described in further detail hereinabove.

Consequently, upon supplying an alternating magnetic field to any of the coils 2492, the pair of magnets 2493 affixed to the side opposite the coil 2492, moves in parallel (or nearly in parallel) to the side opposite the coil 2492.

More specifically, when a coil 2492 positioned opposite the frame's 2494 left side or the frame's 2494 right side is provided with the current, the magnets 2493 on the side move vertically (i.e. up or down).

Similarly, when a coil 2492 positioned opposite the frame's 2494 upper side or the frame's 2494 lower side is provided with the current, the magnets 2493 on the side move horizontally (i.e. left or right).

That is to say that the vibration transducer 2491 of FIG. 24 may be used to induce vibration in a horizontal direction, in a vertical direction, or in both directions.

By replacing the frame 2494 with a cubic frame mounted on an elastic element (or connected to a set of elastic elements, at the frame's 2494 sides), deploying a pair of magnets on each side of the cubic frame, and positioning a coil opposite each of the pairs of magnets, there is allowed an induction of vibrations in three spatial directions. For example, the vibrations may be in a left and right direction, in an up and down direction, forwards and backwards, or in any combination thereof.

Figure 25:
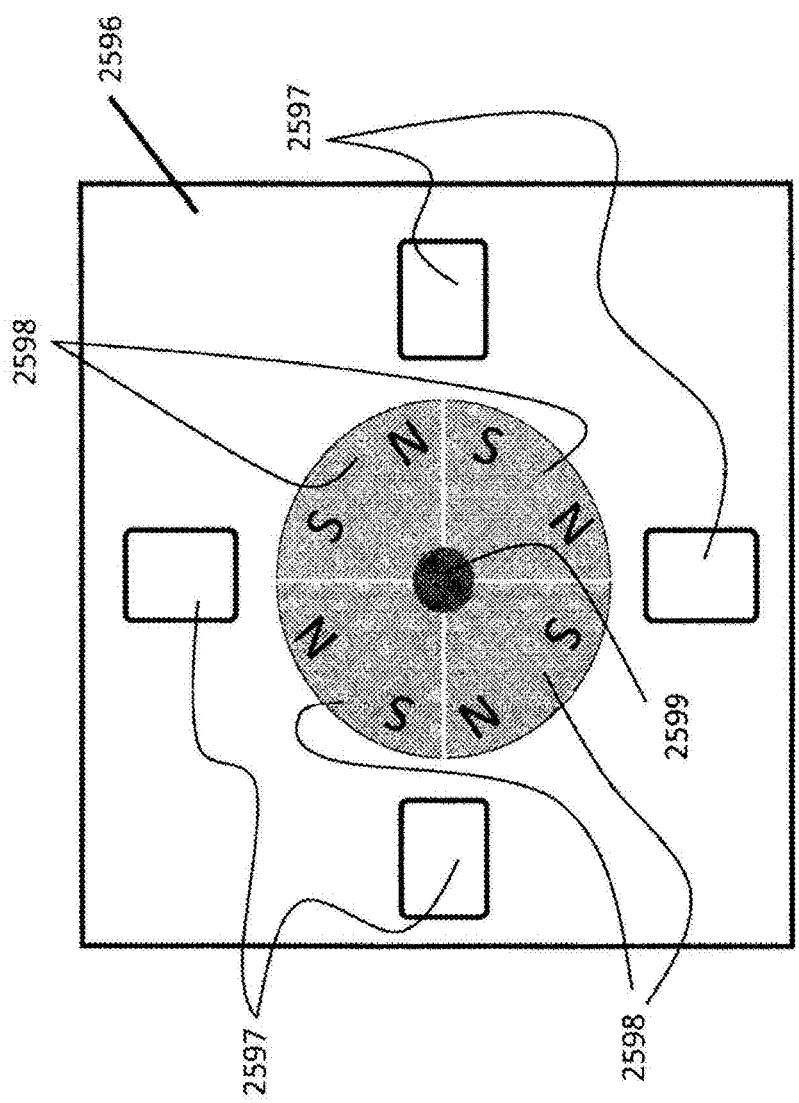
FIG. 25 is a simplified block diagram schematically illustrating a second multi-directional vibration transducer, according to an exemplary embodiment of the present invention.

Reference is now made to FIG. 25, which is a simplified block diagram schematically illustrating a second multi-directional vibration transducer, according to an exemplary embodiment of the present invention.

An exemplary multi-directional vibration transducer 2596 includes four coils 2597.

The multi-directional vibration transducer 2596 further includes four magnets 2598 held together by the magnets' 2598 magnetic fields. The magnets 2598 form a circle around an elastic element 2599 (say a sponge or a set of springs) positioned in the center of the circle.

Alternatively, the magnets 2598 form a circle, but are rather connected at the magnets' 2598 outer side (i.e. at the circle's circumference), to a set of elastic elements (not shown), say springs, which allows vertical and horizontal movement of the magnets 2598.

As shown in FIG. 25, each of the coils 2597 is deployed opposite a point midway between two adjacent ones of the magnets 2598 which are arranged in a zero-cross configuration, as described in further detail hereinabove.

Upon supplying an alternating magnetic field to any of the coils 2597, the pair of magnets 2598 opposite the coil 2597 moves in parallel (or in near parallel) to the core of coil 2597.

More specifically, when a coil 2597 positioned opposite the circle's left side or the circle's right side, is provided with the current, the magnets 2598 on the side move vertically (i.e. up or down).

Similarly, when a coil 2597 positioned opposite the frame's the circle's upper side or the circle's lower side is provided with the current, the magnets 2598 on the side move horizontally (i.e. left or right).

That is to say that the vibration transducer 2596 of FIG. 25 may be used to induce vibration in a horizontal direction, in a vertical direction, or in both directions.

By replacing the magnets 2598 with magnets which together, form a sphere around an elastic element (or connected to a set of elastic elements, at the sphere's surface), there is allowed an induction of vibrations in three spatial directions. For example, the vibrations may be in a left and right direction, in an up and down direction, forwards and backwards, or in any combination thereof.

It is noted that in some embodiments of the invention, it may be desirable to use many small vibration transducers. An example for such use may be in a sole of a shoe, where a number of small vibration transducers can be used—small so as to fit inside a shoe, yet in a number large enough, so as to spread the vibrations over a large part of the sole.

It is noted that in some embodiments of the invention, it may be desirable to use a relatively powerful vibration transducer. The relatively powerful vibration transducer is achieved by using powerful magnets, and/or relatively massive magnets, and/or relatively massive coil or coils. An example for such use may be attached to a chest, where the vibrations are optionally intended to impact on the breast bone.

Personal speakers of the type worn with an MP3 device and the like typically do not provide a significant part of the bass part of a soundtrack to the listener, reducing the listening experience. Embodiments of the present invention are directed to a transducer that provides a quality bass response that varies with amplitude and frequency of input signals. The transducer may be mechanically attached to the body of the listener and the vibrations are conducted directly to the listener's body and reach the ears via the listener's skeleton with the body itself serving as a resonator.

The low frequency components of the media signal, including bass components are transmitted to the transducer which vibrates in response to the received signal, creating a mechanical vibration that is able to respond to the received signal by vibrating significantly at different frequencies over a large range, such that the intensity of the vibration is in indication of amplitude of the low frequency components, and the frequency of the vibration is an indication of the pitch of the received signal.

The transducer is configured to transmit a wide range of signals and overtones while avoiding strongly pronounced natural resonant frequencies. It is typically used in combination with more conventional earphones that provide higher frequency signals to the ears. The addition of the transducer provides a richer experience to the user.

Although the transducer may be used with media items mixed specifically for systems that incorporate it, it may enhance the user experience provided by myriads of currently available media items, such as music albums, video clips and movie soundtracks when listened to using personal systems, since the media as originally recorded includes bass notes and overtones that are not significantly reproduced by the speakers or earphones of personal systems. Thus legacy media items originally mixed for traditional platforms such as a standard stereo system or a regular MP3

Driver, need not be modified or mixed again (with additional channels or a modified distribution of recording channels), for at least some of the present embodiments to work.

Low frequency signals derived or tailored according to some exemplary embodiments of the present invention, are typically signals with frequencies that the human ear is much less sensitive to, whereas other parts of the human body are much more sensitive to. For example, the human ear experiences a gradual decrease in hearing, below a frequency range of 220-250 Hz. Low frequency signals below the range of 220-250 Hz may be tailored for transducers appended to specific body areas, according to some embodiments of the present invention.

Also of interest are very low frequency signals, such as infrasonic signals that are characterized by a frequency lower than 20 Hz, which is usually below limits of human hearing. Such low frequency signals, low frequency (or even infrasonic) vibrations if applied to a user's body, may generate various sensations such as quakes, thumping, shaking, earthquake-like sensations and movement sensations, composite sound and vibration related sensations, etc., as described in further detail hereinbelow.

Embodiments of the invention are directed to a transducer, a system and method for personal media playing with enhanced low frequency sensing.

Figure 26:
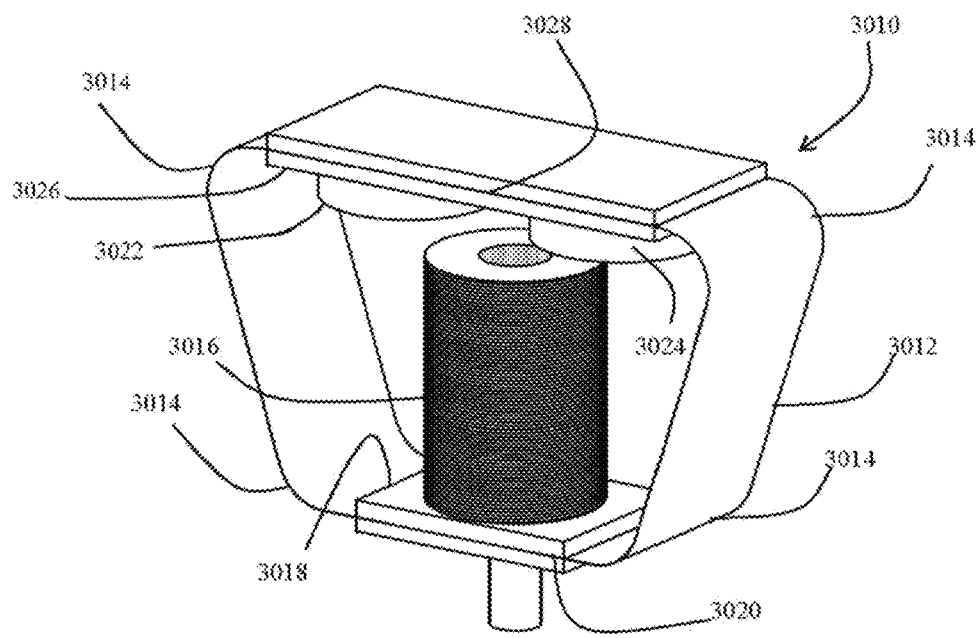
FIG. 26 is a schematic illustration of a vibrating transducer.

With reference to FIG. 26, a vibrating transducer is described. The vibrating transducer 3010 consists of a flat strip of metal formed into a closed metal loop 3012 having a closed non rectangular shape that is preferably symmetrical and with one pair of substantially parallel sides and rounded corners 3014. The device may be trapezoidal shaped, for example. A solenoid 3016 is attached to a surface 3018 a first parallel side 3020 of the closed shape, and fixed magnets 3022, 3024 are attached to a surface 3026 on an opposite parallel side 3028 of the trapezoidal shape to bring the fixed magnets 3022, 3024 into proximity with the solenoid 3016.

The radius of curvature of the corners is selected to avoid distortion of the material and prevent work-hardening or fatigue.

The position of the magnets 3022, 3024 with respect to the solenoid 3016 is designed to keep the magnets within the electromagnetic field of the solenoid, so that although they may be displaced significantly, they remain within the electromagnetic field and are driven back by elastic energy stored in the frame.

Notably, the solenoid is a single core solenoid. Unlike the W shaped solenoid of U.S. Pat. No. 6,982,696 to Shahoian, the solenoid 3016 is a single core solenoid. Preferably the solenoid 3016 is mounted on an inside surface of the closed loop 3012, and preferably the magnets 3022, 3024 are mounted on the inside surface of the parallel side, thereby enabling the solenoid 3016 and magnets 3022, 3024 to be brought into close proximity. The magnets 3022, 3024 are preferably disc shaped, with North and South poles at opposite edges of the disk, rather than on opposite sides. In this manner, the combined magnetic field changes gradually, and the magnets 3022, 3024 oscillate smoothly back and forth with respect to the solenoid 3016, and the transducer 3010 can therefore mechanically respond to complex electronic wave form signals with high fidelity.

The high fidelity vibrating transducer 3010 vibrates in response to a wide range of low frequencies, and, if attached or in contact with a listener's body, can provide low pitch signals to enhance the experience of music through earphones or small speakers. The higher pitches, typically the melody and harmony are experienced acoustically through the ears, and the rhythm of percussion is transmitted by the vibrating device 10 to the listener, via direct contact with the listener's body. In addition to transmitting beats and rhythm at the appropriate frequency, by virtue of the low resistance to deformation, overtones are effectively reproduced and the high fidelity vibrating transducer 3010 can provide accurate reproduction of sounds made by different instruments, giving an experience of double base, tuba, trombone, drums, kettle drums, and the like.

Figure 27:
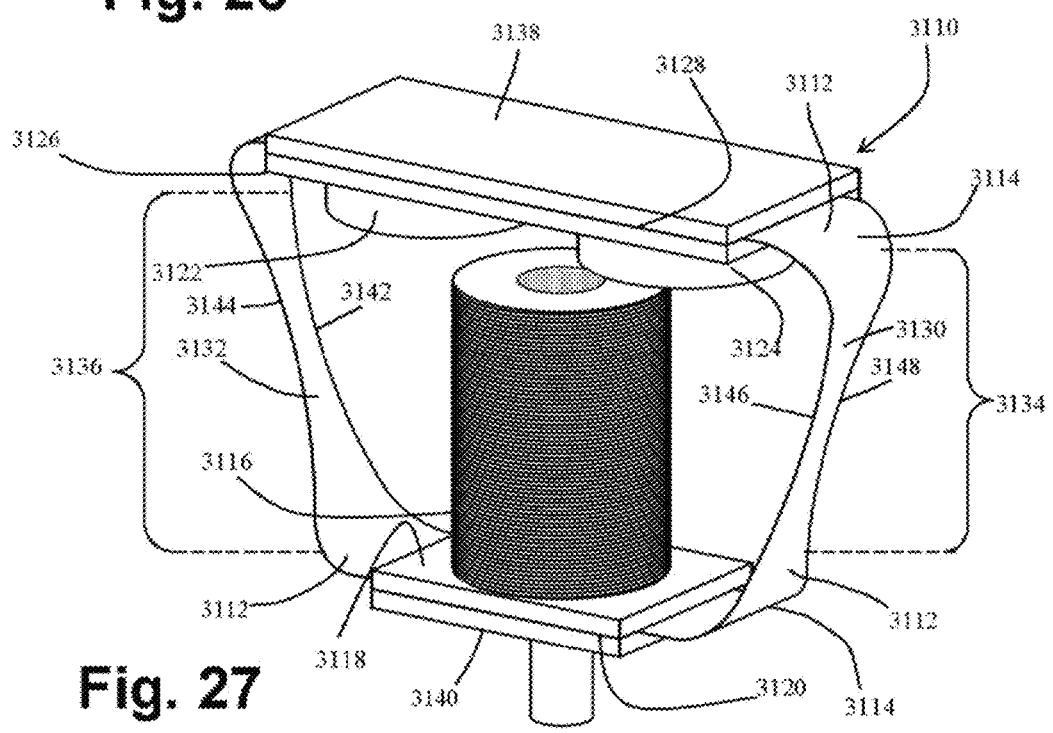
FIG. 27 is a schematic illustration of a vibrating transducer of an embodiment of the invention that has enhanced fidelity.

With reference to FIG. 27, according to an embodiment of the present invention, there is provided a transducer 3110 that has a subtle improvement over the transducer 3010 of FIG. 26. Like the transducer 3010, the improved transducer 3110 comprises a flat strip of metal formed into a closed metal loop 3112 having a trapezoidal shape with rounded corners 3114. A single core solenoid 3116 fixed to an inner surface 3118 on a first parallel side 3120 of the trapezoidal shape, and fixed magnets 3122, 3124 are attached to the inner surface 3126 on an opposite parallel side 3128 of the trapezoidal shape to bring the fixed magnets 3122, 3124 into proximity with the solenoid 3116 mutatis mutandis. However, in contradistinction with the transducer 3010, in the transducer 3110 of the improvement, at least one lateral side 3130 of the trapezoidal shape coupling the parallel sides 3120, 3128 has a section 3134 with continuously varying width, resulting in the transducer 3110 being able to vibrate over a range of frequencies in response to reception of a signal comprising varying frequencies.

Preferably, both lateral sides 3130, 3132 have sections 3134, 3136 of continuously varying width and are symmetrical, such that the width on each lateral side at a common distance from the first side 3120 is the same.

Preferably, both magnets 3122, 3124 are either bar or round magnets having both X and Y seeking poles facing the solenoid 3116 and arranged N-S N-S. Round magnets are preferable, since these have a more gradually changing magnetic field. The magnets 3122, 3124 are preferably very close to the distal end of the solenoid 3116, so that the separation between the magnets 3122, 3124 and the solenoid 3116 is small, typically 1 or 2 millimeters. As the polarity of the solenoid 3116 changes in response of the alternating electrical signal thereto, the magnets 3122-3124 are attracted and repelled in turn. Due to the shape of the strip, which is wide but thin, and has rounded corners 3114, and since the magnets are arranged so that their poles are linearly aligned, tangential to the plane of the trapezoidal frame, the magnets can reciprocate linearly in a plane tangential to the axis of the solenoid 3116 but are not thrown sideways and the frame though vibrates significantly back and forth in the direction parallel to the parallel sides 3120, 3128, hardly twists and warps. By virtue of the continuously varying width of section(s) 3134, (3136) of the lateral sides 3130, (3132), the transducer 3110 is able to vibrate over a range of low frequencies and provides a sensation of pitch. Furthermore, this configuration enables complex vibrations to be transmitted simultaneously and provides overtones, enabling differentiation between different instruments.

As mentioned, due to the shape of the strip, which is wide but thin, with rounded corners 3114, and since the magnets are arranged so that their poles are linearly aligned, tangential to the plane of the trapezoidal frame, the magnets 3122, 3124 can reciprocate linearly in a direction Y-Y tangential to the axis X-X of the solenoid 3116 but the frame is prevented from twisting out of the X-Y plane, preventing noise and signal attenuation and ensuring high fidelity.

To enhance the vibratory signal, preferably one of parallel sides 3120, 3128 and most preferably both parallel sides 3120, 3128 are stiffened by stiffeners 3138, 3140. In this manner, the distortion of the parallel sides is dampened and the vibration of the sections of continuously varying width 3134, 3136 in the lateral sides 3130-3132 is thereby enhanced.

At least one edge 3142 of section(s) of continuously varying width 3134 (3136) may have a concave profile. In this manner, the section(s) 3134 (3136) gradually narrows and then widen again in a direction Z tangential to the plane of the loop X-Y.

Preferably, both edges 3142, 3144, 3146, 3148 of both sections 3134, 3136 of the lateral sides 3130, 3132 coupling the parallel sides 3120, 3128 of the loop have concave profiles, so that both sections gradually narrow and then widen again.

The exact profiles of the sections 3134, 3136 may vary somewhat. The shape of the varying sections may be tailored to increase the fidelity. Thus most preferably, both edges 3142, 3144, 3146, 3148 of both sections 3134, 3136 of the lateral sides 3130, 3132 coupling the parallel sides 3120, 3128 of the loop having concave profiles extend over the entire flat section of the lateral side up to the rounded corners 3114.

For attaching to the body of the listener, the transducer 3110 may include an attachment means 3250 such as a clip 3255 for attachment to a garment of the wearer or a strap 3265 for strapping to the wearer, such as a belt for attaching around the wearer's waist or a ribbon, string or chain for attaching around the wearer's neck. To maximize the vibration response, the strip may be fabricated from spring steel.

For portability, it is preferable that the magnets 3122, 3124 are small and strong, and they may include rare earth minerals such as neodymium and samarium-cobalt, for example.

Figure 28:
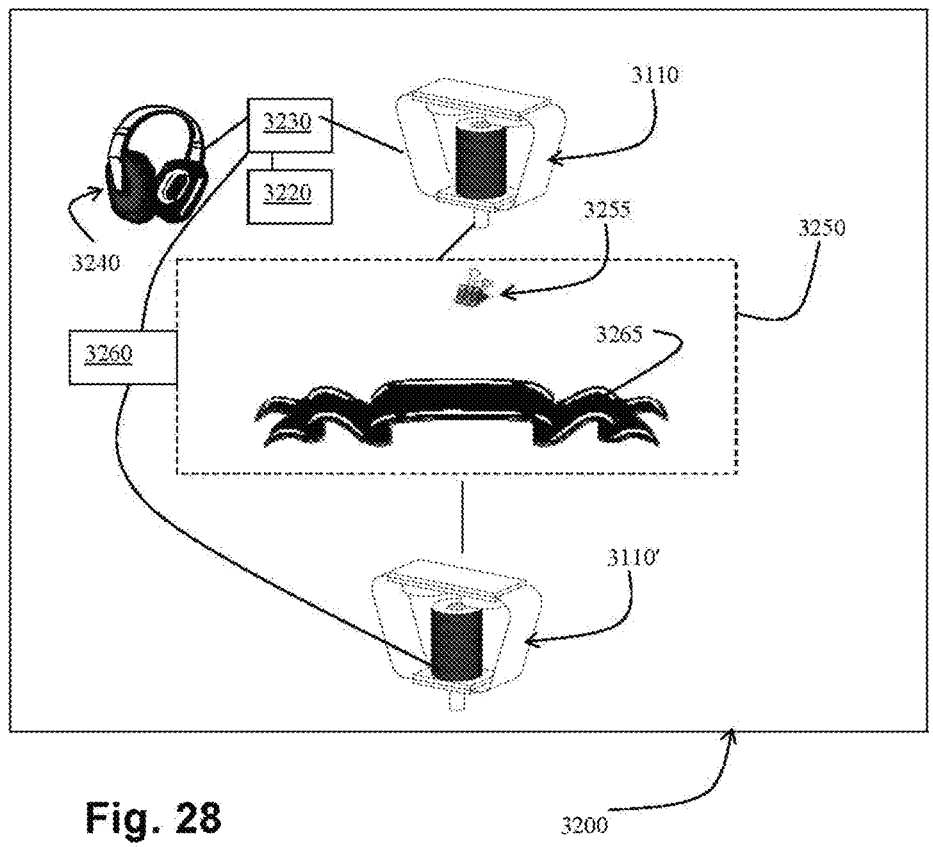
FIG. 28 is a schematic illustration of a system for personal media playing, according to an exemplary embodiment of the present invention.

With reference to FIG. 28, a system 3200 including transducer 3110 is shown. The system comprises a memory 3220 for storing electronic music signals, such as a flash memory or DVD, a signal generator 3230 for generating electronic signals. This is typically an MP3 player, a Smartphone, a DVD drive, speakers or earphones 3240 for transmitting audio frequencies and an attachment means 3250 for attaching the transducer 3110 to the wearer.

Some systems 3200 may include a dedicated processor chip 3260 that sends different signals having different wavelengths at different amplitudes to different transducers 3110, 3110'.

The transducer 3110 receives the media signal from an audio source, such as an MP3 Player (say through the player's headphone socket), a computer, a game console, a media reader such as a CD drive, a smart phone (say Apple™ i-Phone), etc., as known in the art.

A transducer 3110 of the invention may be attached to the chest as a chest vibration device, designed for attachment to an article of clothing wear on the chest area, such as a shirt, a jacket, an undershirt, a bra, and so on, or provided with a strap or an adhesive pad for direct attachment to the chest.

It is noted that a chest vibration device may be particularly recommended for providing a high audio volume sensation such as that of a live concert. When used in high noise surroundings such as live performances, a chest vibration device and optionally also a waist vibration devices, may be attached more tightly to a wear's body. The chest vibration devices may be attached to the wear's body, using one or more of a strap, a belt, an adhesive strap, a semi-rigid adhesive strap, a loop and hook attachment such as a Velcro™ strap, etc., as known in the art.

Optionally, the signal generator 3230 is implemented on a dedicated Digital Signal Processing (DSP) chip, on a desktop computer, on a laptop computer, on a mobile smart phone, etc., as known in the art.

The signal generator 3230 may derive two or more signals from the media signal received from the memory 3220. The derived signals may be similar, or different from each other.

Optionally, the derived signals are low frequency signals. The low frequency signals are signals with frequencies that the human ear is much less sensitive to, whereas other parts of the human body are much more sensitive to (say through touch).

The signal generator 3230 tailors each of the derived signals for a respective one of a plurality of body areas of a user of the apparatus 3200. Optionally, the signal generator 3230 derives the signals for a preset number of body areas, say a number preset by a user or a manufacturer of the apparatus 3200, whereas the media signal's recording may be based on a different number of channels.

In one example, the media signal originates from a hand held stereo media player with two channels, and the signal generator 3230 derives eight channels from the media signal, for eight body areas of a user.

In one example, the signal generator 3230 may tailor one of the derived signals for a specific body area in which bone is close to skin (say on one of the legs, while tailoring another one of the derived signals for a more fleshy body area, such as the waist, as described in further detail hereinbelow.

Figure 29:
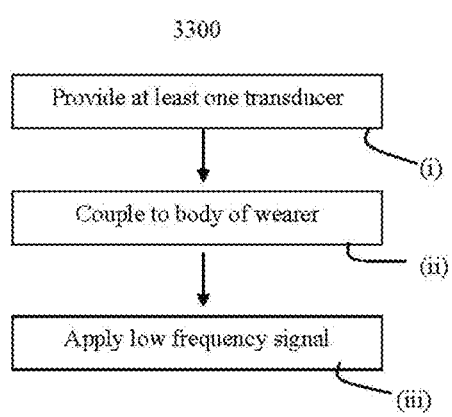
FIG. 29 is a flowchart illustrating a method of enhancing a user's experience by providing a tactile sensation of low frequency acoustic signals.

With reference to FIG. 29, a method 3300 of providing a range of low frequency vibrations to a body part is shown. The method 1300 comprises the steps of: (i) providing a vibrating transducer 3110, again comprising a flat strip of metal formed into a closed metal loop 3112 having a trapezoidal shape with rounded corners 3114. A solenoid 3116 fixed to an inner surface 3118 on a first parallel side 3120 of the trapezoidal shape, and fixed magnets 3122, 3124 are attached to the inner surface 3126 on an opposite parallel side 3128 of the trapezoidal shape to bring the fixed magnets 3122, 3124 into proximity with the solenoid 3116. Preferably at least one lateral side 3130 of the trapezoidal shape coupling the parallel sides 3120, 3128 has a sections 1134 with continuously varying width, resulting in the transducer 3110 being able to vibrate over a range of frequencies in response to reception of a signal comprising varying frequencies; (ii) mechanically coupling the transducer 3110 to a body part, typically via a belt, strap or clip, for example, and (iii) applying a low frequency electromagnetic signal to a solenoid 3116 of the vibrating transducer 3110, therereby generating vibrations in the transducer 3110 that emulate the low frequency signal. The low frequency electromagnetic signal may be the bass notes of a piece of music, a soundtrack of a movie, a signal of a video clip encoded in an MP4 format, a video stream, etc. from a DVD, MP3 or MP4 player, magnetic tape or other storage device.

The low frequency signal that the transducer 3110 produces as mechanical vibrations may have a bass frequency in the range of sub Hz to 250 KHz. In some embodiments, the low frequency electromagnetic signal has overtones of a musical instrument. In some embodiments, the low frequency electromagnetic signal has an infrasound frequency.

In this manner a subject to whom the transducer is coupled, who may be wearing the transducer attached to the body or to a garment, will be subjected to a hi fidelity signal that corresponds to the bass and low frequency signals of the media signal, including harmonics and secondary vibrations. When the subject is also subjected to higher audio frequency vibrations, such as treble signals, for example, a more complete immersion experience into the music is experienced than that of a subject merely experiencing the higher frequencies, or higher frequencies with a low frequency monotonic or nearly monotonic vibration from a vibrator configured to provide vibrations at a fixed frequency.

The subject may wear more than one such transducer 3110. For example, the subject may wear a transducer on the back and one on the chest, or one in each foot, thereby providing a further enhanced experience.

For example, one of the signals derived from the media signal, may be tailored for a specific body area in which bone is close to skin (say one of the legs), whereas another one of the derived signals may be tailored for a more fleshy body area, such as the waist. Such tailoring of the signal may include insertion of a certain signal sequence into the signal derived from the media signal, changing the derived signal's waveform, compressing certain parts of the derived signal, etc. Each of the tailored signals may be transmitted to one or more vibration transducers, deployed on the specific body area that the signal is tailored for. Consequently, each of the vibration devices vibrates on the specific body area, according to the signal tailored for the specific body area.

In some embodiments, each of the signals derived from the media signal is destined for a specific body region. The derived signal may be transmitted unchanged to one or more vibration devices deployed on the specific body area of the user. Upon receiving the transmitted low frequency signal, the vibration device vibrates on the body area, in a manner optimal for the body area. The vibration device vibrates in the manner optimal for the body area, say by virtue of a vibration device design optimal for the specific body area.

A method according to an exemplary embodiment of the present invention may be used with media items mixed specifically for the method. However, the tailoring of the signals, may add a new user experience to millions of currently available media items, such as video clips or movie soundtracks, using the media as originally recorded. That is to say that legacy media items originally mixed for traditional platforms, say a standard stereo system, or a regular MP3 Driver, need not be modified or mixed again (with additional channels or a modified distribution of recording channels), by the media's producer, for at least some of the present embodiments to work.

Low frequency signals derived or tailored according to some exemplary embodiments of the present invention, are typically signals with frequencies that the human ear is much less sensitive to, whereas other parts of the human body are much more sensitive to.

For example, the human ear experiences a gradual decrease in hearing, below a frequency range of 220-250 Hz. Low frequency signals below the range of 220-250 Hz may thus be tailored for specific body areas, according to some embodiments of the present invention. Of special interest are lower frequency signals, such as infrasonic signals that are characterized by a frequency lower than 20 Hz, which is usually below limits of human hearing.

Based on the tailored low frequency signals, low frequency (or even infrasonic) vibrations applied to the user's body, may generate low frequency sensations such as quakes, thumping, shaking, earthquake-like sensations, movement sensations, composite sound and vibration related sensations, etc., as described in further detail hereinbelow.

The system 3200 further includes two or more transducers 3110, in communication with the signal generator 3230, through a wired or wireless connection, and wear by the user of the system 3200.

Optionally, at least one of the transducers 3110 is wireless and the signal generator 130 communicate with the transducers 3110 through a wireless connection, using one wireless communication frequency. Alternatively, the signal generator 3230 communicates with the transducer 3110 using more than one wireless communication frequency, say when many users in close proximity use similar systems 1200.

The low frequency part of the signal may be tailored for a transducer 3110 by one or more signal manipulations. Such signal manipulations may include, but are not limited to: insertion of a certain signal sequence into the derived signal, changing the derived signal's waveform, compressing certain parts of the derived signal, filtering and equalization of specific frequency ranges, introduction of delays among signals derived from the media signal, for different body areas and the like. That is to say that the signal generator 3130 may optimize each of the tailored signals for a specific body area.

Optionally, the signal generator 3230 tailors the signal derived from the media signal, with a waveform optimal for the body area to which the transducer 3110 is appended.

Optionally, the signal generator 3230 tailors the signal derived from the media signal, by inserting a predefined sequence to the derived signal.

For example, the signal generator 3230 may insert a specific signal sequence stored in a dedicated database of vibration effects (say a sequence typical of a boom effect) to the derived signal, whenever the signal generator 3230 identifies a predefined sequence (say a sound typical of an explosion) in the media signal.

Optionally, the signal generator 3230 tailors the derived signals, so as to simulate a specific environment, such as an open air environment, a closed hall environment, a car with powerful low frequency speakers, an environment with a wood floor, an environment with a concrete floor, etc.

For example, the signal generator 3230 may insert a sequence of floor vibration emulating vibrations to the derived signal.

Optionally, the signal generator 3230 is preconfigured with specific amplifications, delays or phase differences, based on measurements made on a user's body locations during a live sound experience in a specific environment. The signal generator 3230 may tailor the derived signals for the specific environment, using the specific amplifications, delays or phase differences, as measured in the specific environment.

Optionally, the user of the system 3200 is allowed to select one the environments, say using a control panel 3260, for the signal generator 3230 to tailor the derived signals for, as described in further detail hereinbelow.

The media signal may be a signal produced upon playing of a standard, one of millions of currently available media items, such as music clips, video clips, or movie soundtracks. That is to say that the signal generator 3230 may tailor the derived signals, using the media item as originally recorded. There is generally no need for a producer of the media item to re-mix the media with special vibration channels or with a new distribution among recording channels, or to provide a complement mix of vibration channels, in order for the transducer and systems including it to work.

That is to say that media items originally mixed for traditional platforms, such as a standard stereo system or a regular MP3 Driver, need not be modified or remixed, for the exemplary system 3200 to work.

The transducer 3110 may be configured to vibrate on the body area to which it is attached, in a manner optimal for the body area.

In the example, the transducer 3110 may vibrate in a direction which best suits the specific body area that the transducer is deployed on, say in a direction perpendicular to a fleshy body area of a wearer the system 3200, or transversely to a bony body area of the wearer, as describe in further detail hereinbelow.

Optionally, the vibration device 3110 itself further includes a signal tailoring capacity (say a dedicated electric circuit for signal processing, or a frequency selective amplifier), as described in further detail hereinbelow.

Using the signal tailoring capacity, the transducer may further tailor the tailored signal for the specific area, as received by the transducer, say by further changing the received signal's waveform or by amplifying only parts of the signal that are in a low frequency range.

Optionally, the signal generator 3230 introduces a phase difference between at least two signals derived and tailored for different body areas of the user and sent to different transducers 3110, 3110', say for generating a sensation which moves up from a lower body area to a higher body area, or vise versa.

Optionally, the signal generator 3230 further uses control data embedded in the received media signal in accordance with a predefined protocol, for tailoring the derived signals. For example, the signal generator may introduce a certain signal sequence to the signal derived from the media signal, upon identifying a certain tone in the media signal received from the memory 3220, as described in further detail hereinbelow.

Where the system 3200 includes a control panel 3260, to provide a user interface which may be operated by a user of the system 3200, for controlling the signal generator 3230, the control panel 3260 may be a set switches or a touch screen, in communication with the signal generator 3230, for example.

The user may use the control panel 3260 to adjust the amplitude of a signal tailored for a specific body area (say the user's chest), thereby moderating the vibrations felt on the user's chest, adjust the amplitude of the tailored signals in general, etc., as described in further detail hereinbelow.

Typically the signal generator 3230 of the system 3200 further includes an audio signal generator 3230 (for generating audio signals for transmitting to the speakers or earphones 3240.

The audio signal generator 3270 derives an audio signal from the received media signal, thus reproducing at least a part of the media signal, for the user to hear.

Systems 3200 for personal media playing may be implemented as hardware, or as a combination of hardware and software.

Optionally, at least one of the transducers 3110, 3110' is wireless and the signal generator 230 communicate with the transducer through a wireless connection, using one wireless communication frequency. Alternatively, the signal generator 3230 communicates with the transducer(s) 3110 using more than one wireless communication frequency, say when many users use similar systems 200 in close proximity.

In some embodiments, the wireless connection is a limited range connection, with a useful range of 5-6 meters, or even 2-3 meters. In some other embodiments, the wireless connection is a limited range connection, with a useful range of 10-20 meters, or 30 meters.

In some embodiments, the transducer(s) 3110, 3110' of the invention may be a foot transducer intended to fit on or in a shoe. Such foot transducers may be provided in pairs and fit to each shoe or attached to the foot with an elastic band (not shown), or an elastic sock (not shown), etc.

In some embodiments of the present invention, foot transducers are designed to be located 5 next to a foot by being produced as an under-the-foot shoe insert.

Each of the parts of the system 3200 may require a source of electrical energy.

The sources of electrical energy may be a battery 3270 which may be either regular or rechargeable. Additional methods of providing electrical energy to parts of the system 200 include, but are not limited to: using a person's movements to generate electrical energy, using induction coils that receive energy radiated from an energy transmitter, or using rechargeable batteries, say with large capacitors, etc.

Additional methods of providing energy to the parts of the system 3200 may include storing and releasing mechanical energy, such as winding and releasing a mechanical spring (not shown).

According to some exemplary embodiments of the present invention, vibrations applied by different transducers, on each specific body area, may have area-specific characteristics.

In some embodiments, the signal generator 3230 tailors the low frequency signals with a waveform shaped for inducement of vibrations that emulate movement like sensations, such as the sensations felt in an open air theater, a closed dance club, a car having powerful bass speakers, and so on.

In some embodiments, the system 3200 filters out or substantially attenuates certain frequencies suspected of causing bowel movements, nausea, lung collapse, etc.

Some Example Applications of the Present Invention

The present invention, in some embodiments thereof, may enhance sound experience in public show venues, whether movie theaters, cinemas, live shows, either instead of loud bass speakers and sub-woofer speakers, or in addition to such speakers. Such an application may lower the disturbance such sound makes in the vicinity of the public shows.

Sound technicians, stage performers, use what is termed as "headphone clicks", for receiving signals which are not audible to persons not wearing the headphones. The present invention, in some embodiments thereof, may provide body vibrations to complement or to replace "headphone clicks".

The present invention, in some embodiments thereof, may fill out the sound experience in a personal device used by persons in conjunction with cinemas, movies, games, simulators, audio-visual and non-visual simulation environments and systems, and virtual reality systems. By way of a non-limiting example, embodiments of the present invention may be used to produce a substantially realistic feeling of recoil when a game includes shooting.

In some embodiments of the invention, a feeling of a straight line movement is imparted to a user. In order to understand the source of the feeling, it is noted that vibrations include a back and forth movement. In an embodiment for producing a feeling of movement, a harsh movement is produced in one direction of the back and forth movement and a substantially gentler return movement is produced in the opposite direction. A user feels the harsh movement more than the gentle return and the feeling is as if the user moves in one direction. A non-limiting example of a signal suitable for producing such a feeling is an asymmetric saw tooth-like signal, with either a sharp rise and a gentle fall, or a gentle rise and a sharp fall, as described in further detail hereinabove.

Vibration transducers constructed according to some embodiments of the present invention, may optionally be used for indication and/or tactile feedback purposes, such as enabling deaf users to feel warning sounds and/or a vehicle reverse warning, and such as tactile feedback for controlling equipment, based on amplitude or frequency of vibration sensations.

The present invention, in some embodiments thereof, may optionally simulate an acoustic environment. The simulation may be of a realistic environment, and also of an artificial environment not typical of real life. The simulation may enable changing a musical environment, to simulate a concert hall effect in open air, and vice versa.

The present invention, in some embodiments thereof, may optionally simulate an acoustic or an environment characterized by certain vibrations, for purposes of research on human responses, for medical purposes, and so on. By way of a non-limiting example, specifically the brown, yellow, and/or green frequencies may be amplified and not attenuated.

The present invention, in some embodiments thereof, may optionally simulate an acoustic environment such as a cradle, a car, an airplane, and so on.

The present invention, in some embodiments thereof, may optionally quiet down an acoustic environment, by picking up environmental sounds and canceling the vibration sensation produced by the environmental sounds.

The present invention, in some embodiments thereof, may optionally produce vibration sensation in a vacuum or near vacuum environment, or under water, or environments where sound is hard to produce or does not travel well. The source of the sound is optionally provided by wire or wirelessly, and the vibrations produced are induced directly to the user's body, and/or clothes, and/or attached accessories, without relying on air for sound and/or vibration conductance.

Vibration transducers constructed according to some embodiments of the present invention, may optionally be used for medical purposes, such as psycho-acoustic therapy, tissue and bone therapy using sound waves and/or low frequency vibrations, physiotherapy, treatment of vertigo and/or balance, and treatment of digestion problems.

Optional encoding schemes for the low frequencies

According to an exemplary embodiment of the present invention, a low frequency signal encoding the vibrations to be applied to the body at different body locations is formatted according to an industry standard which may be created by vendors in the music industry.

In some embodiments of the invention, a standard LFE (Low Frequency Effects) channel is used as input for an audio source of a system, as described in further detail hereinabove.

In some embodiments of the invention, a new low frequency signal is embedded in a specific range of frequencies, as described hereinabove. Optionally, the new low frequency signal spans approximately 0-30 Hz.

The new signal may be placed in different locations in current encodings.

In some embodiments, the new signal optionally replaces the LFE signal, with an understanding that the LFE is not to be fed to a sub-woofer. Optionally, sound systems may be retro-fitted to identify that a LFE channel is carrying the new signal.

In some embodiments of the present invention, the low frequency signal is embedded in a slice of a higher frequency part of the audio spectrum. Optionally, the low frequency signal may be embedded in a high frequency part of the audio spectrum, such as approximately 19 KHz and up, typically higher than human hearing capacity. Since the low frequency provides a relatively low data rate when embedded into the high frequency, one or more low frequency channels may optionally be embedded into the higher frequency. Optionally, the low frequency signal is attenuated. Optionally, the low frequency signal is embedded out-of-phase with the high frequency signal present in the high frequency slice.

As described above, there are a number of vibrating transducers that provide bass sensation to music listeners, transducers for providing directional tugging and infrasound to gamers and for enhancing the immersive experience of multimedia.

Sometimes, such transducers are attached to the body with surgical or other adhesive tape. Removal of adhesive tape sometimes epilates hair and may be painful. Adhesive tape may also leave a sticky residue on the skin or on clothing. If a transducer is attached to clothing by an adhesive tape, the weight of the transducer may pull the clothing away from the body resulting in a fold or ripple such that the transducer is not in contact with the body.

Another way to attach a transducer to the body is to hang it in place loosely around the neck using a string. Vibrations may be transmitted from such a transducer through the string, and as long as the transducer is in contact with the user's chest, vibrations may be sensed through the ribcage. This solution generally works well for someone walking around slowly or sitting back or upright in a chair. However, if the wearer leans forwards, runs, sleeps or is involved in many other activities, the transducer may temporarily disconnect from the body.

A further way to attach a transducer to the body is with an elastic band that holds the transducer tight against the chest. Unfortunately, where such a band is in contact with the skin, it may cause irritation, redness from restricted blood flow, and/or sweat rashes in humid environments or where the wearer is involved in strenuous physical activity.

There is a need for an improved system and method for holding a transducer against the thorax.

Figure 30:
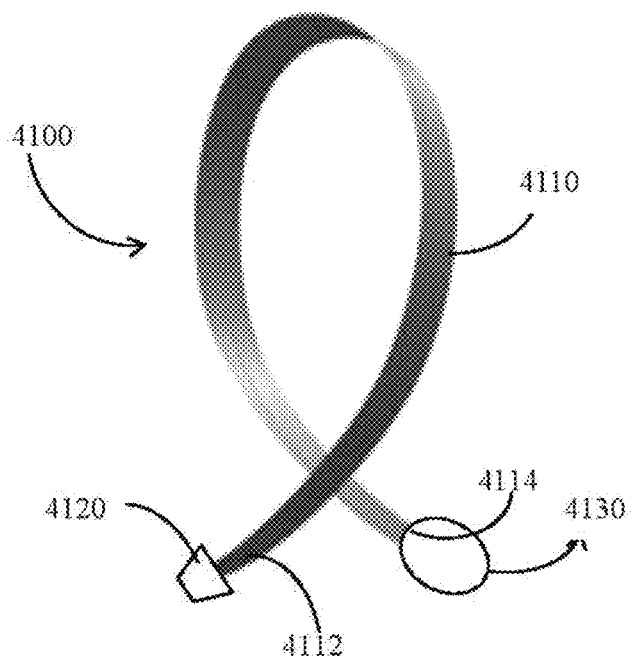
FIG. 30 is a schematic diagram of an embodiment of the invention.
Figure 31:
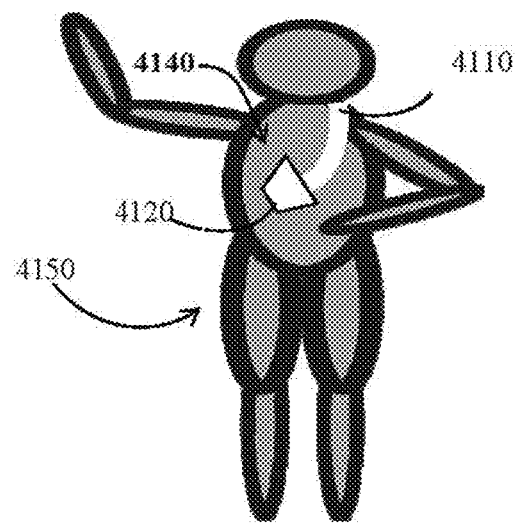
FIG. 31 is a schematic diagram of a person wearing the embodiment of FIG. 1.

With reference to FIGS. 30 and 31, a device 4100 including a transducer 4120 and a u shaped open loop 4110 for holding the transducer 4120 against the torso 4140 of a wearer 4150 is shown.

The device 4100 comprises a U shaped open loop 4110 having a ventral end 4112 that presses on the torso 4140 of the wearer 4150, and a dorsal end 4114 that presses on the back of the wearer 4150, such that the transducer 4120 is attached to the ventral end 4112 of the U shaped open loop 4110 of the support 4100 and presses on the chest region of the torso 4140. A non-slip pad 4130, such as a piece of Velcro™ hook fabric may be attached to the dorsal end 4114 of the U shaped open loop 4110 to facilitate fastening the U shaped loop to fabric. In some embodiments, the transducer 4120 (or a second transducer) may be attached to the dorsal end 4114 of the U shaped open loop 4110 so that it presses on the back of the wearer 4150.

The U shaped open loop 4110 may be fabricated from plastic, metal or any other fairly resilient springy material. For cost and ease of manufacture, it may be fabricated from a strip of steel and is typically 40-60 cm long. 300 Series stainless steel such as SS 302 or SS 310 for example, has been found to be appropriate. To be sufficiently rigid but easy to bend and to open, typically, the strip of steel is less than 1 mm thick and less than 20 mm wide. The dimensions, may, however, vary widely.

In a preferred embodiment, the U shaped open loop 4110 is fabricated in sections that are hinged together such that ends of adjacent sections are in contact when the loop is in its open configuration. It this manner, the U shaped loop 4110 may be easily folded down for storage.

Although the U shaped loop is suitable for holding a variety of transducers against the torso, including sensors, pace makers and the like, in some embodiments, the transducer 4120 is a vibrator. Such vibrators may be used to provide tactile signals to the wearer 4150.

It is well known that the music sensation from personal stereo systems with headphones is often 'tinny' since such headphones do not reproduce the bass notes. An appropriate vibrating transducer may be configured to provide a bass sensation to music listeners. Bass frequency vibrations applied to the torso, particularly to the rib cage, enhance the music experience of the wearer as such deep notes are picked up from the floor or the seat, and transmitted through the skeleton to the ear, rather than transmitted through the air.

Vibrating type transducers will typically include arrangements of one or more permanent magnets and one or more solenoids and will utilize the Faraday effect to create physical movement from varying electrical signals through a solenoid whose magnetic field interacts with that of the permanent magnets.

It will be appreciated that the vibrating transducers of FIGS. 26 and 27 may be conveniently and securely positioned on the thorax of a wearer against the rib cage using the device 4110 described in FIGS. 30 and 31.

Such a transducer may be worn in conjunction with earphones and may thereby enhance the music listener's experience by transmitting bass signals. In addition, asymmetrical low frequency waves may provide a directional tugging that can be utilized by gamers and in virtual reality environments.

Indeed, the vibrator may be used to transmit very low frequency signals (infrasound) to gamers or to members of the audience in an immersive virtual reality environment or watching a film, since infrasound vibrations affect mood, and may provide a sensation of spookiness, for example. Thus the vibrator may be used to enhance multimedia.

With reference to FIG. 32, a second aspect of the invention is directed to a method of attaching a transducer 4120 to a torso 4140 of a wearer comprising the steps of: (alpha) providing a device 4100 for the transducer 4120 for holding the transducer 4120 against the chest of a wearer 4150. The device comprises a U shaped open loop 4110 having a ventral end 4112 that presses on the chest 4140 of the wearer 4150, and a dorsal end 4114 that presses on a back of the wearer 4150, such that the transducer 4120 is attached to one of the ventral 4112 and dorsal 4114 ends, (beta) attaching the transducer 4120 to the wearer 4150 and (gamma) holding it against the torso 140.

Figure 33:
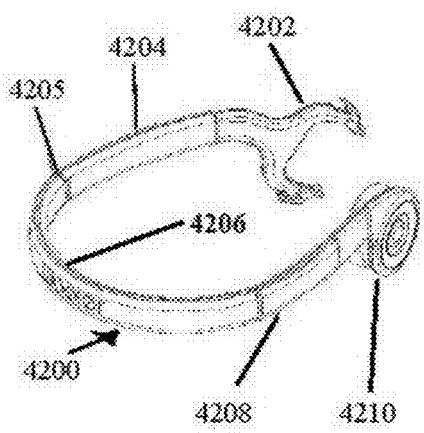
FIG. 33 is a first perspective view of a preferred embodiment.
Figure 34:
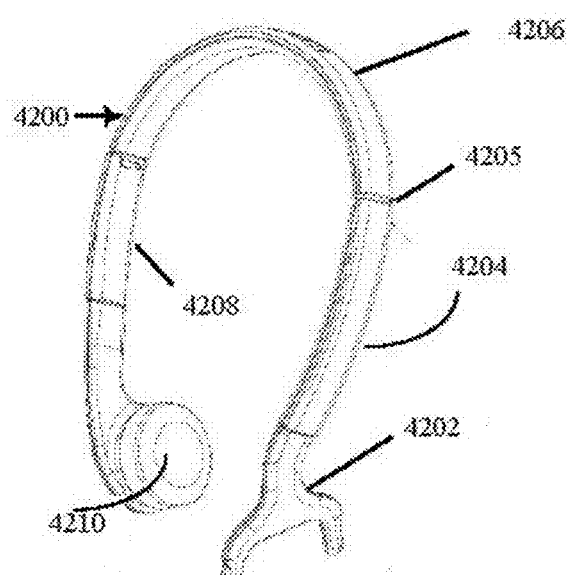
FIG. 34 is a second perspective view of the preferred embodiment.

With reference to FIGS. 33 and 34, a preferred device is a U shaped open loop 4200 consists of elements 4202, 4204, 4206, 4208, 4210 hinged together by hinges 4205. U shaped open loop 4200 may be folded on hinges 4205, but when unfolded, the elements engage each other and transmit vibrations along the U shaped open loop 4200. Element 4202 is a clip for a transducer 4110 such as the transducers 4010 and 4110 that provide haptic signals. Element 4210 may be a high friction pad such as a Velcro™ or adhesive pad, or may be a control switch, for example. Although described above with reference to haptic transducers, it will be appreciated that there are a variety of other transducers that need to be held in contact with the body, including heartbeat monitors, stethoscope-like tools for listening to the heartbeat, ultrasound transducers and the like. The device discussed in FIGS. 30, 31, 33 and 34 may be applicable to such transducers.

It is expected that during the life of this patent many relevant devices and systems will be developed and the scope of the terms herein, particularly of the terms "Digital Signal Processing (DSP)", "Chip", "Electric Circuit", "Amplifier", "Filter", "Magnet", "LFE (Low Frequency Effects)", "Channel", "Transmitter" and "Receiver", is intended to include all such new technologies a priori.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

The invention claimed is:

1. A support clip for holding a vibrating transducer against a body of a wearer, the support clip comprising a U shaped open loop having a ventral end that presses on a torso of the wearer, and a dorsal end that presses on a back of the wearer, such that said vibrating transducer is attached to one of said ventral and dorsal ends, said vibrating transducer comprising, a coil and an array of magnets arranged around an axis of the coil, and distanced from the coil, a frame comprising a flat strip of metal formed into a symmetrical trapezoidal shaped closed metal loop having rounded corners, the coil fixed to a first parallel side of the frame, and the array of magnets coupled to an opposite parallel side of the frame a frame, wherein an alternating current in the coil causes the array of magnets to wiggle in a plane about the axis, substantially perpendicular to the axis of the solenoid.

2. The support clip of claim 1 wherein said vibrating transducer is attached to the ventral end of the U shaped open loop.

3. The support clip of claim 1 wherein said vibrating transducer is attached to the dorsal end of the U shaped open loop.

4. The support clip of claim 1 wherein a non-slip pad is attached to the dorsal end of the U shaped open loop.

5. The support clip of claim 1 wherein the U shaped open loop comprises a strip of steel.

6. The support clip of claim 1 wherein said vibrating transducer is configured to provide a bass sensation to music listeners.

7. The support clip of claim 4 wherein the non-slip pad comprises a pad of a hook and loop fastener fabric.

8. The support clip of claim 5 wherein the strip of steel is less than 1 mm thick and less than 20 mm wide.

9. The support clip of claim 5 wherein the strip of steel comprises a 300 Series stainless steel.

10. The support clip of claim 5 wherein the strip of steel comprises SS 302 or SS 310.

11. The support clip of claim 6 wherein said vibrating transducer is configured to provide a directional tugging.

12. The support clip of claim 6 wherein said vibrating transducer is configured to provide infrasound to gamers.

13. The support clip of claim 6 wherein said vibrating transducer supports multimedia.

14. The support clip of claim 6 comprising sections that are joined to each other by hinges, such that when said sections are opened out, ends of adjacent sections are aligned and in contact so that vibrations are transmitted along the support.

\* \* \* \* \*